United States Patent
Jung et al.

(10) Patent No.: US 12,527,084 B2
(45) Date of Patent: Jan. 13, 2026

(54) DISPLAY APPARATUS

(71) Applicant: Samsung Display Co., Ltd., Yongin-si (KR)

(72) Inventors: Minsik Jung, Yongin-si (KR); Jeonghwan Kim, Yongin-si (KR); Junhwi Park, Yongin-si (KR); Yongduck Son, Yongin-si (KR); Dabin Lee, Yongin-si (KR); Wonho Jang, Yongin-si (KR)

(73) Assignee: Samsung Display Co., Ltd., Suwon-si (KR)

( * ) Notice: Subject to any disclaimer, the term of this patent is extended or adjusted under 35 U.S.C. 154(b) by 440 days.

(21) Appl. No.: 17/473,156

(22) Filed: Sep. 13, 2021

(65) Prior Publication Data

US 2022/0140058 A1    May 5, 2022

(30) Foreign Application Priority Data

Nov. 2, 2020  (KR) .................. 10-2020-0144580

(51) Int. Cl.
*H10K 59/131* (2023.01)
*H10D 86/40* (2025.01)
(Continued)

(52) U.S. Cl.
CPC ......... *H10D 86/443* (2025.01); *H10K 50/115* (2023.02); *H10K 59/131* (2023.02);
(Continued)

(58) Field of Classification Search
CPC .. H10K 59/131; H10K 50/115; H10K 50/844; H10K 59/38; H10K 2102/103;
(Continued)

(56) References Cited

U.S. PATENT DOCUMENTS 6,259,119 B1  7/2001  Ahn et al.
7,884,913 B2  2/2011  Kook et al.
(Continued)

FOREIGN PATENT DOCUMENTS

JP   2008-041277     2/2008
KR   10-2014-0020565  2/2014
(Continued)

OTHER PUBLICATIONS

Extended European Search Report dated Mar. 17, 2022, issued to European Patent Application No. 21206078.4.

*Primary Examiner* — Kyoung Lee
(74) *Attorney, Agent, or Firm* — Sughrue Mion, PLLC

(57) ABSTRACT

A display apparatus includes a substrate, a thin-film transistor, a display element, a pad, a contact layer, and a pad-protecting layer. The substrate includes a display area and a peripheral area outside the display area. Each of the thin-film transistor and the display element is arranged in the display area. The pad is arranged in the peripheral area. The contact layer is electrically connected to the pad. The pad-protecting layer is on the contact layer and exposes a portion of the contact layer to the outside. The pad includes a first pad layer and a second pad layer. The first pad layer is connected to a connection wiring through a first contact hole. The second pad layer is spaced apart from the first pad layer and is connected to the first pad layer through a second contact hole.

25 Claims, 15 Drawing Sheets

(51) Int. Cl.
*H10K 50/115* (2023.01)
*H10K 59/38* (2023.01)
*H10K 59/80* (2023.01)
*H10K 102/10* (2023.01)

(52) U.S. Cl.
CPC ......... *H10K 59/38* (2023.02); *H10K 59/8731* (2023.02); *H10K 2102/103* (2023.02)

(58) Field of Classification Search
CPC ............... H10K 59/12; H10K 50/8426; H10K 2102/331; H01L 27/1248; H01L 27/1244; H01L 27/124; G02B 5/201
See application file for complete search history.

(56) References Cited

U.S. PATENT DOCUMENTS

| | | |
|---|---|---|
| 9,219,244 B2 | 12/2015 | Lee |
| 11,362,309 B2 | 6/2022 | Chung et al. |
| 2009/0315451 A1* | 12/2009 | Choi .................... H10K 59/131 438/22 |
| 2013/0242372 A1* | 9/2013 | Park ........................ B05D 1/26 359/290 |
| 2014/0353620 A1* | 12/2014 | Park .................... H10K 59/124 438/34 |
| 2016/0190504 A1 | 6/2016 | Koshihara |
| 2018/0321764 A1* | 11/2018 | Oh ....................... H10K 77/111 |
| 2019/0115400 A1* | 4/2019 | Park .................... G09G 3/3275 |
| 2019/0140029 A1* | 5/2019 | Kim .................... H10K 77/111 |
| 2019/0319221 A1* | 10/2019 | Ohchi ................. H10K 71/621 |
| 2019/0348485 A1 | 11/2019 | Jo et al. |
| 2020/0006452 A1 | 1/2020 | Lee et al. |

FOREIGN PATENT DOCUMENTS

| | | |
|---|---|---|
| KR | 10-1386574 | 4/2014 |
| KR | 10-2017-0078243 | 7/2017 |
| KR | 10-2019-0063793 | 6/2019 |
| KR | 10-2020-0003955 | 1/2020 |
| KR | 10-2020-0096384 A | 8/2020 |

\* cited by examiner

DISPLAY APPARATUS

CROSS-REFERENCE TO RELATED APPLICATIONS

This application claims priority to and the benefit of Korean Patent Application No. 10-2020-0144580, filed Nov. 2, 2020, which is hereby incorporated by reference for all purposes as if fully set forth herein.

BACKGROUND

Field

One or more embodiments generally relate to a display apparatus.

Discussion

A display apparatus visually displays an image. A display apparatus may include a substrate divided into a display area and a peripheral area. The display area may include a scan line and a data line insulated from each other, and a plurality of pixels. In addition, a thin-film transistor and pixel electrodes (each corresponding to a respective pixel among the pixels) may also be provided in the display area. The pixel electrode may be electrically connected to the thin-film transistor. In addition, an opposite electrode may be provided in the display area. The opposite electrode may be provided in common with respect to the pixels. Various wirings, a scan driver, a data driver, a controller, a pad portion, etc., may be configured to transfer electric signals to the display area may be provided in the peripheral area.

The purposes of display apparatuses have diversified. Accordingly, designs to improve the quality of display apparatuses have been tried in various ways.

The above information disclosed in this section is only for understanding the background of the inventive concepts, and, therefore, may contain information that does not form prior art.

SUMMARY

One or more embodiments provide a display apparatus capable of preventing a defect with respect to a pad portion arranged in a peripheral area and displaying a high-quality image in a display area.

Additional aspects will be set forth in the detailed description which follows, and, in part, will be apparent from the disclosure, or may be learned by practice of the inventive concepts.

According to an embodiment, a display apparatus includes a substrate, a thin-film transistor, a display element, a pad, a contact layer, and a pad-protecting layer. The substrate includes a display area and a peripheral area outside the display area. Each of the thin-film transistor and the display element is arranged in the display area. The pad is arranged in the peripheral area. The contact layer is electrically connected to the pad. The pad-protecting layer is on the contact layer and exposes a portion of the contact layer to the outside. The pad includes a first pad layer and a second pad layer. The first pad layer is connected to a connection wiring through a first contact hole. The second pad layer is spaced apart from the first pad layer and is connected to the first pad layer through a second contact hole.

According to an embodiment, a display apparatus includes a substrate, a thin-film transistor, a display element, a pad, a contact layer, and a pad-protecting layer. The substrate includes a display area and a peripheral area outside the display area. Each of the thin-film transistor and the display element is arranged in the display area. The pad is arranged in the peripheral area. The contact layer is electrically connected to the pad. The pad-protecting layer is arranged on the contact layer. The pad-protecting layer exposes a portion of the contact layer to the outside.

The foregoing general description and the following detailed description are illustrative and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate embodiments of the inventive concepts, and, together with the description, serve to explain principles of the inventive concepts. In the drawings.

DETAILED DESCRIPTION OF SOME EMBODIMENTS

Figure 1A:
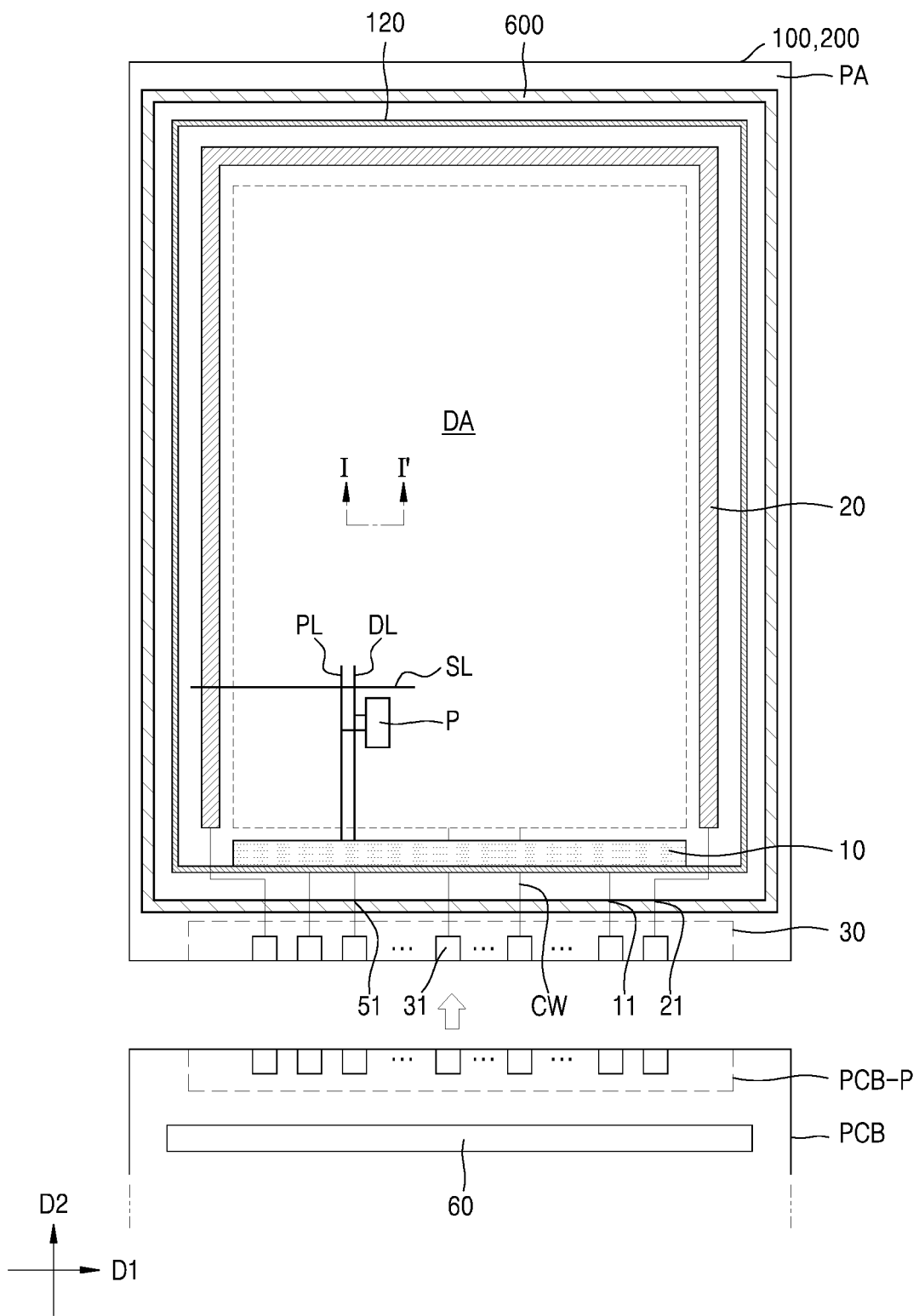
FIG. 1A is a plan view of a display apparatus according to an embodiment.

In the following description, for the purposes of explanation, numerous specific details are set forth in order to provide a thorough understanding of various embodiments. As used herein, the terms "embodiments" and "implementations" may be used interchangeably and are non-limiting examples employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing example features of varying detail of some embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. In addition, the X-axis, the Y-axis, and the Z-axis are not limited to three axes of a rectangular coordinate system, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing some embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional views, isometric views, perspective views, plan views, and/or exploded illustrations that are schematic illustrations of idealized embodiments and/or intermediate structures. As such, variations from the shapes of the illustrations as a result of, for example, manufacturing techniques and/or tolerances, are to be expected. Thus, embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the inventive concepts. Further, the blocks, units, and/or modules of some embodiments may be physically combined into more complex blocks, units, and/or modules without departing from the inventive concepts.

Hereinafter, various embodiments will be explained in detail with reference to the accompanying drawings.

According to some embodiments, a display apparatus is an apparatus capable of displaying an image and may be an organic light-emitting display apparatus, an inorganic light-emitting display apparatus, a quantum-dot light-emitting display apparatus, a field-emission display apparatus, a surface-conduction electron-emitter display apparatus, a plasma display apparatus, or the like. Hereinafter, although an organic light-emitting display apparatus will be described an example, embodiments are not limited thereto.

Figure 1B:
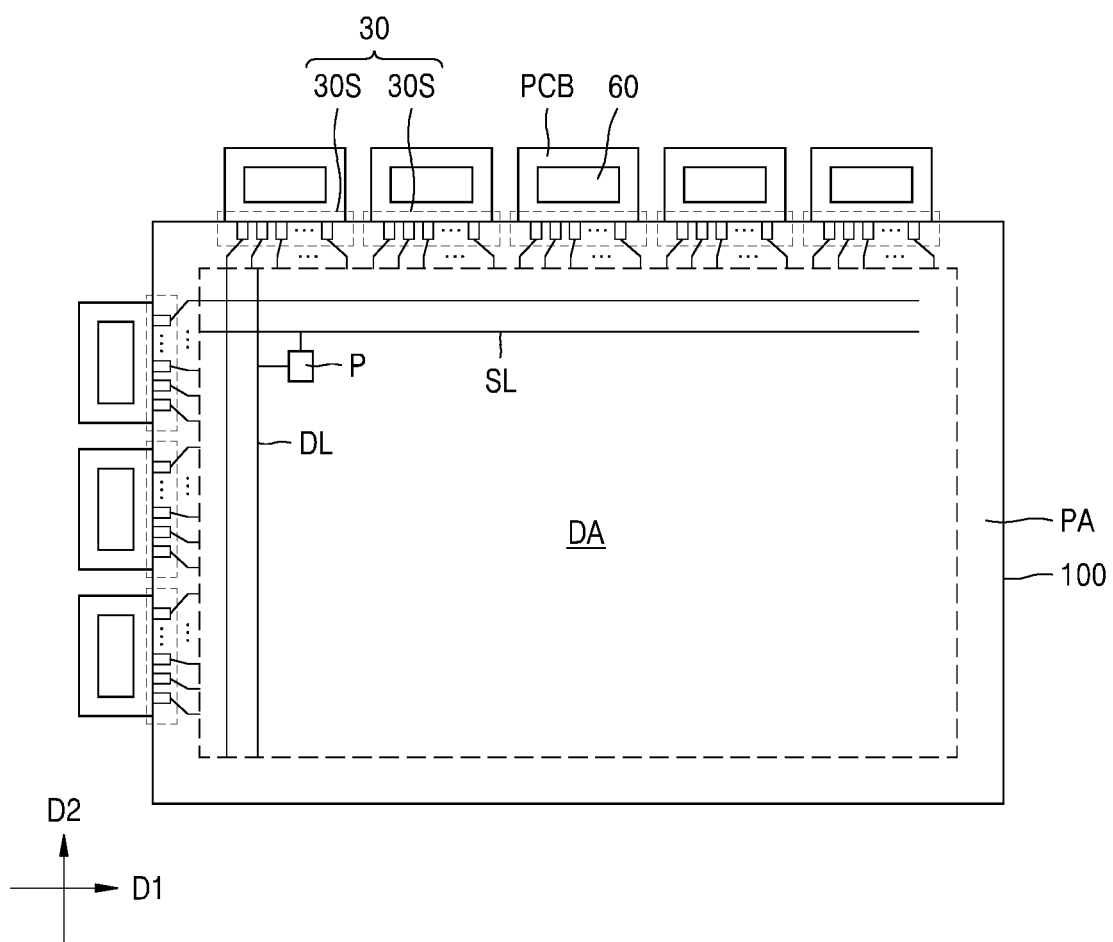
FIG. 1B is a plan view of a display apparatus according to an embodiment.

FIGS. 1A and 1B are plan views of a display apparatus according to some embodiments.

Referring to FIG. 1A, the display apparatus may include a substrate 100 and a top substrate 200 attached to each other through a sealing member 600. The sealing member 600 may be formed to surround the outer surfaces of the substrate 100 and the top substrate 200 to attach the substrate 100 to the top substrate 200.

The display apparatus includes a display area DA and a peripheral area PA around (or outside) the display area DA. The display apparatus may provide an image using light emitted from a plurality of pixels P arranged in the display area DA.

The display area DA includes pixels P connected to a data line DL and a scan line SL. The data line DL extends in a first direction and the scan line SL extends in a second direction intersecting with the first direction. Each pixel P is also connected to a driving voltage line PL extending in the first direction.

Each of the pixels P may include a display element, such as an organic light-emitting diode, but embodiments are not limited thereto. Each pixel P may emit light having, for example, red, green, blue, or white color from an organic light-emitting diode OLED (see, e.g., FIGS. 2A and 2B). For the purposes of this disclosure, a pixel P may be understood as a sub-pixel that emits light having red, green, blue, or white color as described above. In an embodiment, organic light-emitting diodes OLED included in the pixels P may emit light having the same color, and a color of each pixel P may be implemented by (or include) a color filter, etc., arranged on the organic light-emitting diode OLED.

Each pixel P may be electrically connected to built-in circuits arranged in the peripheral area PA. A first power supply line 10, a second power supply line 20, and a pad portion 30 may be arranged in the peripheral area PA.

The first power supply line 10 may be arranged to correspond to one side of the display area DA. The first power supply line 10 may be connected to a plurality of driving voltage lines PL configured to transfer a driving voltage (also referred to as a first power voltage) ELVDD (see FIGS. 2A and 2B described below) to a pixel P.

The second power supply line 20 may surround a portion of the display area DA in a loop shape having one open side. The second power supply line 20 may provide a common voltage to an opposite electrode of a pixel P. The second power supply line 20 may be called a common voltage supply line.

The pad portion 30 may include a plurality of pads 31 and may be arranged on one side of the substrate 100. Each of the pads 31 may be connected to a first connection wiring 11 or connection wirings CW. The first connection wiring 11 may be connected to the first power supply line 10, and the connection wirings CW may extend to the display area DA. The pads 31 of the pad portion 30 may be electrically connected to a printed circuit board PCB by being exposed by not being covered by an insulating layer. A terminal portion PCB-P of the printed circuit board PCB may be electrically connected to the pad portion 30. The pad portion 30 may be provided for a test, such as a test of the pixels P of the display area DA, but embodiments are not limited thereto. A pad portion for a test may be formed similar to the pad portion 30. At least a portion of the pad portion 30 may be arranged in the peripheral area PA and then removed from a final product, such as after one or more tests a performed. The pads 31 of the pad portion 30 for a test may be covered by an insulating layer and only a portion of the pads 31 may be exposed. The pads 31 covered by the insulating layer may be used as tags for various tests. The pads 31 covered by the insulating layer will be described later in more detail.

The printed circuit board PCB is configured to transfer a signal or power of a controller to the pad portion 30. The controller may respectively provide the driving voltage ELVDD and a common voltage ELVSS (see FIGS. 2A and 2B described below) to the first and second power supply lines 10 and 20 through first and second connection wirings 11 and 21.

A data driving circuit 60 is electrically connected to the data line DL. A data signal of the data driving circuit 60 may be provided to each pixel P through the connection wiring CW and the data line DL. The connection wiring CW is connected to the pad portion 30, and the data line DL is connected to the connection wiring CW. Although it is shown in FIG. 1A that the data driving circuit 60 is arranged on the printed circuit board PCB, the data driving circuit 60 may be arranged on the substrate 100 in another embodiment. As an example, the data driving circuit 60 may be arranged between the pad portion 30 and the first power supply line 10.

The pads 31 of the pad portion 30 for a test may be connected to circuits of each pixel P through the connection wiring CW.

A dam portion 120 may be arranged in the peripheral area PA. While an organic encapsulation layer 420 (see FIG. 10) of a thin-film encapsulation layer 400 is formed, the dam portion 120 may block an organic material flowing toward in an edge direction of the substrate 100 to prevent an edge tail of the organic encapsulation layer 420 from being formed. The dam portion 120 in the peripheral area PA may surround at least a portion of the display area DA. The dam portion 120 may include a plurality of dams. In the case where a plurality of dams are arranged, the dams may be spaced apart from each other. The dam portion 120 in the peripheral area PA may be closer to the display area DA than the sealing member 600 in the peripheral area PA. In an embodiment, a built-in driving circuit portion may be further provided in the peripheral area PA. The built-in driving circuit portion may provide a scan signal to each pixel P. In an embodiment, the built-in driving circuit portion may overlap the dam portion 120.

Although it is shown in FIG. 1A that one printed circuit board PCB is attached to the pad portion 30, a plurality of printed circuit boards PCB may be attached to the pad portion 30, such as seen in FIG. 1B.

In some embodiments, the pad portion 30 may be arranged along the periphery of the substrate 100. The pad portion 30 may include a plurality of sub-pad portions 30S. One printed circuit board PCB may be attached to each sub-pad portion 30S. In another embodiment, the printed circuit board PCB may be attached to some of the plurality of sub-pad portions 30S. Others of the plurality of sub-pad portions 30S may be used for a test. In this case, the sub-pad portion 30S used for a test may not be removed after being used for a test. Alternatively, the sub-pad portion 30S used for a test may be removed after being used for a test. In this case, the sub-pad portion 30S used for a test may not be arranged in a line with the sub-pad portion 30S connected to the printed circuit board PCB. For instance, the sub-pad portion 30S used for a test may be arranged farther away from the display area DA than the sub-pad portion 30S connected to the printed circuit board PCB. In this case, when the sub-pad portion 30S used for a test is removed after a test is complete, only the sub-pad portion 30S connected to the printed circuit board PCB may be left. The pad portion 30 for a test will be now be described in more detail.

Figure 1C:
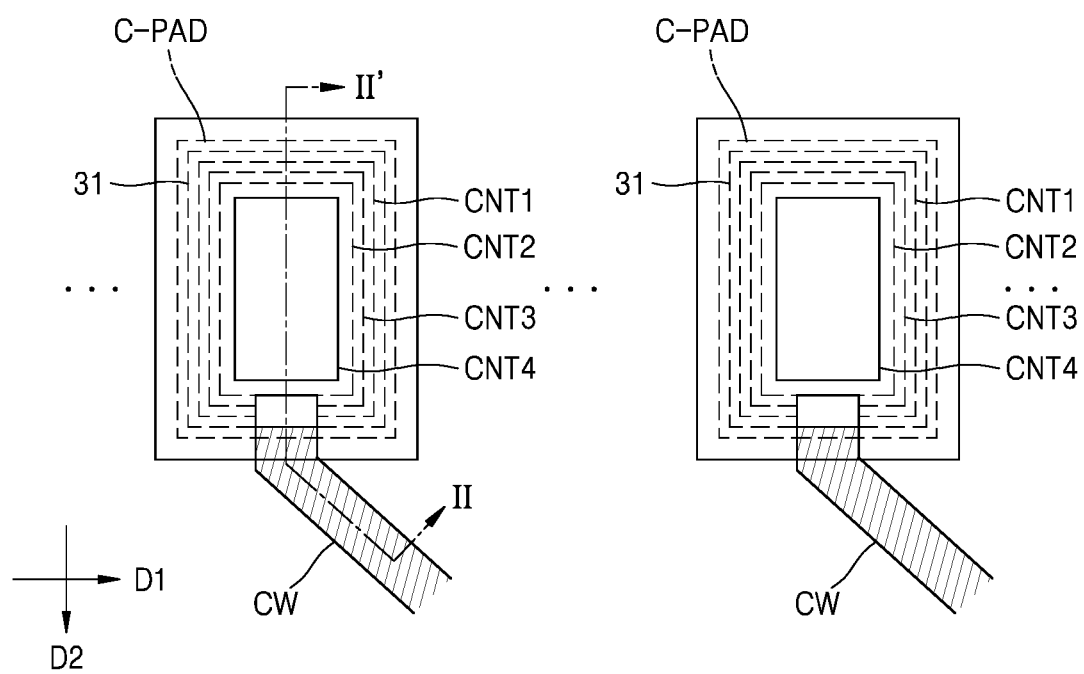
FIG. 1C is an enlarged plan view of a portion of a pad of FIG. 1A or 1B according to an embodiment.

FIG. 1C is an enlarged plan view of a portion of a pad of FIG. 1A or 1B according to some embodiments.

Referring to FIG. 1C, the pad 31 may be connected to the connection wiring CW through a first contact hole CNT1, the connection wiring CW extending to the display area DA. The upper portion of the pad 31 may be covered by a contact layer C-PAD. In this case, the pad 31 may include a first contact hole CNT1 and a second contract hole CNT2. The contact layer C-PAD may be connected to the pad 31 through a third contact hole CNT3. In addition, a pad-protecting layer 118a (see, e.g., FIG. 3) including a fourth contact hole CNT4 may be arranged on the contact layer C-PAD. The pad-protecting layer 118a may expose only a portion of the contact layer C-PAD.

The first contact hole CNT1 and the second contact hole CNT2 may be formed in shapes corresponding to each other. As an example, in the case where a planar shape of the first contact hole CNT1 is a polygon, a planar shape of the second contact hole CNT2 may be a polygon. In another embodiment, in the case where the planar shape of the first contact hole CNT1 is a circle, the planar shape of the second contact hole CNT2 may be a circle. For instance, the planar shape of the first contact hole CNT1 may be the same as the planar shape of the second contact hole CNT2.

In this case, the second contact hole CNT2 may be arranged inside the first contact hole CNT1 in a plan view. For example, in a plan view, the center of the second contact hole CNT2 may coincide with the center of the first contact hole CNT1. In this case, a linear distance from the periphery of the second contact hole CNT2 to the periphery of the first contact hole CNT1 may be the same over the entire periphery of the second contact hole CNT2.

In addition, in a plan view, the contact layer C-PAD may completely cover the first contact hole CNT1 and the second contact hole CNT2. For example, in a plan view, the planar shape of the first contact hole CNT1 and the shape of the second contact hole CNT2 may be arranged inside the planar shape of the contact layer C-PAD.

Furthermore, in a plan view, the planar shape of the fourth contact hole CNT4 may be arranged inside the planar shape of the contact layer C-PAD.

Figure 2A:
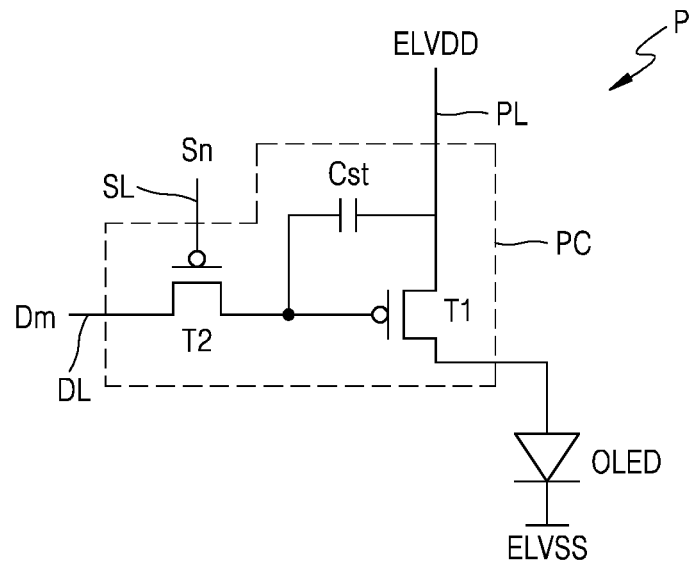
FIG. 2A is an equivalent circuit diagram of a pixel of the display apparatus of FIGS. 1A and 1B according to an embodiment.
Figure 2B:
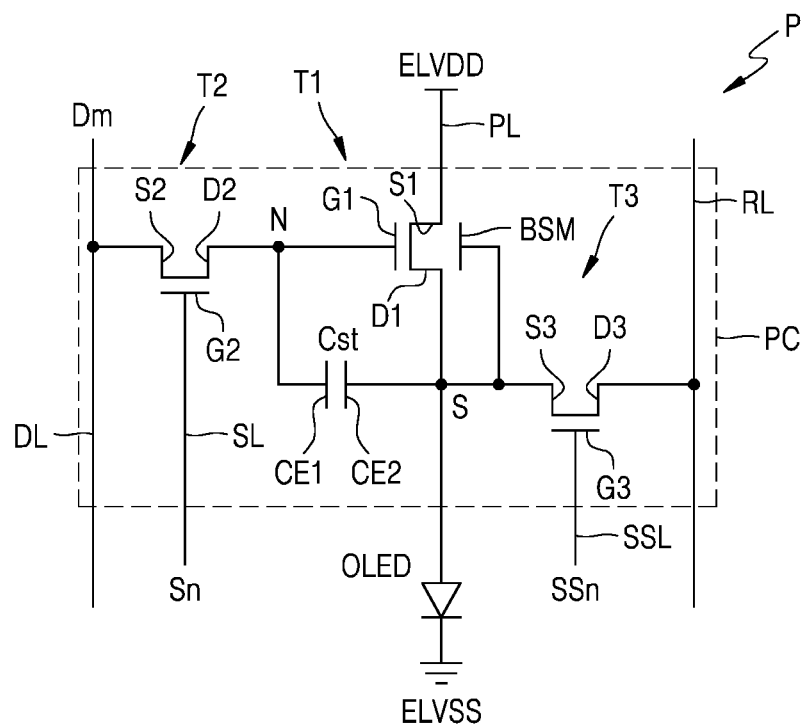
FIG. 2B is an equivalent circuit diagram of a pixel of the display apparatus of FIGS. 1A and 1B according to another embodiment.

FIGS. 2A and 2B are equivalent circuit diagrams of a pixel of the display apparatus according to some embodiments.

Referring to FIG. 2A, each pixel P includes a pixel circuit PC and an organic light-emitting diode OLED, the pixel circuit PC being connected to a scan line SL and a data line DL, and the organic light-emitting diode OLED being connected to the pixel circuit PC.

The pixel circuit PC includes a driving thin-film transistor T1, a switching thin-film transistor T2, and a storage capacitor Cst. The switching thin-film transistor T2 is connected to the scan line SL and the data line DL and is configured to transfer a data signal Dm to the driving thin-film transistor T1 according to a scan signal Sn input through the scan line SL, the data signal Dm being input through the data line DL.

The storage capacitor Cst is connected to the switching thin-film transistor T2 and a driving voltage line PL and is configured to store a voltage corresponding to a difference between a voltage transferred from the switching thin-film transistor T2 and a first power voltage ELVDD (or a driving voltage) supplied to the driving voltage line PL.

The driving thin-film transistor T1 is connected to the driving voltage line PL and the storage capacitor Cst and may control a driving current flowing to the organic light-emitting diode OLED from the driving voltage line PL according to the voltage stored in the storage capacitor Cst. The organic light-emitting diode OLED may emit light having a brightness according to the driving current.

Although it is shown in FIG. 2A that the pixel circuit PC includes two thin-film transistors and one storage capacitor, embodiments are not limited thereto.

Referring to FIG. 2B, each pixel P may include a pixel circuit PC including the organic light-emitting diode OLED and a plurality of thin-film transistors that drive the organic light-emitting diode OLED. The pixel circuit PC may include the driving thin-film transistor T1, the switching thin-film transistor T2, a sensing thin-film transistor T3, and the storage capacitor Cst.

The scan line SL may be connected to a gate electrode G2 of the switching thin-film transistor T2, the data line DL may be connected to a source electrode S2, and a first electrode CE1 of the storage capacitor Cst may be connected to a drain electrode D2.

Accordingly, the switching thin-film transistor T2 supplies a data voltage Dm of the data line DL to a first node N in response to a scan signal Sn from the scan line SL.

A gate electrode G1 of the driving thin-film transistor T1 may be connected to the first node N, a source electrode S1 may be connected to the driving voltage line PL configured to transfer the driving voltage ELVDD, and a drain electrode D1 may be connected to an anode of the organic light-emitting diode OLED.

Accordingly, the driving thin-film transistor T1 may adjust an amount of current flowing through the organic light-emitting diode OLED according to a source-gate voltage Vgs of the driving thin-film transistor T1, e.g., a voltage applied between the driving voltage ELVDD and the first node N.

A gate electrode G3 of the sensing thin-film transistor T3 may be connected to a sensing control line SSL, a source electrode S3 may be connected to a second node S, and a drain electrode D3 may be connected to a reference voltage line RL. In an embodiment, the sensing thin-film transistor T3 may be controlled by the scan line SL instead of the sensing control line SSL.

The sensing thin-film transistor T3 may sense an electric potential of a pixel electrode (e.g., the anode) of the organic light-emitting diode OLED. The sensing thin-film transistor T3 supplies a pre-charging voltage from the reference voltage line RL to the second node S in response to a sensing signal SSn from the sensing control line SSL, or supplies a voltage of the pixel electrode (e.g., the anode) of the organic light-emitting diode OLED to the reference voltage line RL during a sensing period.

The first electrode CE1 of the storage capacitor Cst is connected to the first node N, and the second node CE2 of the storage capacitor Cst is connected to the second node S. The storage capacitor Cst stores a voltage corresponding to a difference between voltages respectively applied to the first and second nodes N and S, and supplies the stored voltage as a driving voltage for the driving thin-film transistor T1. As an example, the storage capacitor Cst may store a voltage corresponding to a difference between a data voltage Dm and a pre-charging voltage Vpre respectively applied to the first and second nodes N and S.

A bias electrode BSM may be formed to correspond to the driving thin-film transistor T1 and be connected to the source electrode S3 of the sensing thin-film transistor T3. At least because the bias electrode BSM is supplied with a voltage in cooperation with an electric potential of the source electrode S3 of the sensing thin-film transistor T3, the driving thin-film transistor T1 may be stabilized. In an embodiment, the bias electrode BSM may be connected to a separate bias wiring without being connected to the source electrode S3 of the sensing thin-film transistor T3.

An opposite electrode (e.g., a cathode) of the organic light-emitting diode OLED is supplied with the common voltage ELVSS. The organic light-emitting diode OLED emits light by receiving the driving current from the driving thin-film transistor T1.

Although it is shown in FIG. 2B that each pixel P includes the signal lines (e.g., the scan line SL, the sensing control line SSL, and the data line DL), the reference voltage line RL, and the driving voltage line PL, embodiments are not limited thereto. As an example, at least one of the signal lines (e.g., the scan line SL, the sensing control line SSL, and the data line DL), and/or the reference voltage line RL, and/or the driving voltage line PL may be shared by neighboring pixels.

The pixel circuit PC is not limited to the number of thin-film transistors or the number of storage capacitors. The circuit design described with reference to FIGS. 2A and 2B, and the number of thin-film transistors, the number of storage capacitors, and the circuit design may be variously changed.

Figure 3:
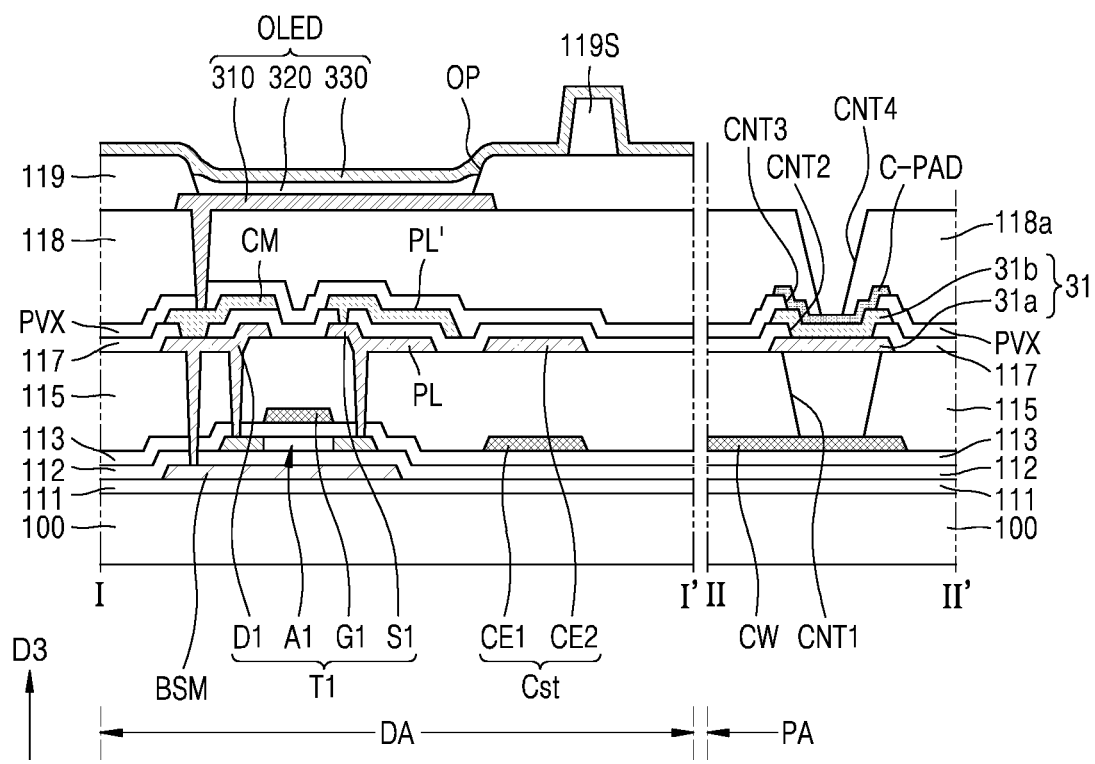
FIG. 3 is a cross-sectional view of a display apparatus according to an embodiment.

FIG. 3 is a cross-sectional view of a display apparatus according to an embodiment.

Referring to FIG. 3, a display apparatus according to an embodiment includes the pad 31 in the peripheral area PA. The edge of the pad 31 may be covered by an inorganic protective layer PVX, and the central portion of the pad 31 may be covered by the contact layer C-PAD. In this case, the third contact hole CNT3 may be formed in the inorganic protective layer PVX. The contact layer C-PAD may be connected to the pad 31 through the third contact hole CNT3.

The contact layer C-PAD may include an oxide having a lower oxidation degree than a material of the pad 31 and having strong corrosion resistance. The pad 31 may have a multi-layered structure. In an embodiment, the pad 31 may include a first pad layer 31a and a second pad layer 31b. The first pad layer 31a and the second pad layer 31b may each have a multi-layered structure. In this case, the first pad layer 31a may be connected to the second pad layer 31b through the second contact hole CNT2. The first pad layer 31a may be connected to the connection wiring CW through the first contact hole CNT1.

The display area DA of FIG. 3 shows the driving thin-film transistor T1 and the storage capacitor Cst in the pixel circuit PC of a pixel P described with reference to FIGS. 2A and 2B. For convenience of description, the structure in FIG. 3 is described according to a stacking order.

The substrate 100 may include at least one of glass, a ceramic material, a metal material, and a polymer resin material, such as polyimide. The substrate 100 may further include a single layer or a multi-layer of the above materials. In the case of the multi-layer, the substrate 100 may further include an inorganic layer.

A first buffer layer 111 may be arranged on the substrate 100. The first buffer layer 111 may prevent or reduce impurities from below the substrate 100, etc., penetrating a semiconductor layer Al. The first buffer layer 111 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The bias electrode BSM may be arranged on the first buffer layer 111 to correspond to the driving thin-film transistor T1. For instance, the bias electrode BSM may overlap the semiconductor layer Al of the driving thin-film transistor T1. A voltage may be applied to the bias electrode BSM. As an example, the bias electrode BSM may be connected to the source electrode S3 (see FIG. 2B) of the sensing thin-film transistor T3 (see FIG. 2B), and thus, the voltage of the source electrode S3 may be applied to the bias electrode BSM. In some embodiments, the bias electrode BSM may prevent external light from reaching the semiconductor layer Al. Accordingly, a characteristic of the driving thin-film transistor T1 may be stabilized. The bias electrode BSM may be omitted depending on the case.

A second buffer layer 112 may cover the bias electrode BSM and may be formed on the entire surface of the substrate 100. The second buffer layer 112 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The semiconductor layer Al may be arranged on the second buffer layer 112. The semiconductor layer Al may include amorphous silicon or polycrystalline silicon. In another embodiment, the semiconductor layer Al may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, the semiconductor layer Al may include a Zn-oxide-based material and include Zn-oxide, In—Zn oxide, and Ga—In—Zn oxide. In another embodiment, the semiconductor layer Al may include In—Ga—Zn—O (IGZO), In—Sn—Zn—O (ITZO), or In—Ga—Sn—Zn—O (IGTZO) semiconductor containing metal, such as indium (In), gallium (Ga), and tin (Sn) in ZnO. The semiconductor layer Al may include a channel region, a source region, and a drain region. The source region and the drain region may be respectively arranged on two opposite sides of the channel region. The semiconductor layer A1 may include a single layer or a multi-layer.

The gate electrode G1 is arranged over the semiconductor layer A1 with a gate insulating layer 113 therebetween such that the gate electrode G1 overlaps at least a portion of the semiconductor layer A1. The gate electrode G1 may include at least one of molybdenum (Mo), aluminum (Al), copper (Cu), and titanium (Ti), and may include a single layer or a multi-layer. The first electrode CE1 of the storage capacitor Cst may be arranged on the same layer as the gate electrode G1. The first electrode CE1 may include the same material as the gate electrode G1.

In the peripheral area PA, the connection wiring CW may be arranged on the gate insulating layer 113. The connection wiring CW may extend to the display area DA and may be connected to other wirings on a different layer through a contact hole. In the peripheral area PA, the connection wiring CW may be connected to the pad 31 through the first contact hole CNT1 defined in a first interlayer insulating layer 115.

The gate insulating layer 113 may include an inorganic insulating material. The gate insulating layer 113 may include, for instance, at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The first interlayer insulating layer 115 may cover the gate electrode G1 and the first electrode CE1 of the storage capacitor Cst. The first interlayer insulating layer 115 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

The second electrode CE2 of the storage capacitor Cst, the source electrode S1, the drain electrode D1, and the driving voltage line PL may be arranged on the first interlayer insulating layer 115. The first pad layer 31a may be arranged on the first interlayer insulating layer 115 in the peripheral area PA. The first pad layer 31a may be arranged on the same layer as the second electrode CE2 of the storage capacitor Cst, the source electrode S1, the drain electrode D1, and the driving voltage line PL. The first pad layer 31a may be connected to the connection wiring CW through the first contact hole CNT1.

The second electrode CE2 of the storage capacitor Cst, the source electrode S1, the drain electrode D1, the driving voltage line PL, and the first pad layer 31a may include a conductive material including, for example, at least one of molybdenum (Mo), aluminum (Al), copper (Cu), and titanium (Ti), and may include a single layer or a multi-layer structure. As an example, the second electrode CE2, the source electrode S1, the drain electrode D1, the driving voltage line PL, and the first pad layer 31a may include a multi-layered structure of Ti/Cu in which a first layer includes Ti and a second layer includes Cu. The source electrode S1 and the drain electrode D1 may be respectively connected to a source region and a drain region of the semiconductor layer A1 through a contact hole.

The second electrode CE2 of the storage capacitor Cst overlaps the first electrode CE1 with the first interlayer insulating layer 115 therebetween, and constitutes a capacitor in cooperation with the first electrode CE1. In this case, the first interlayer insulating layer 115 may serve as a dielectric layer of the storage capacitor Cst. The thickness of the first interlayer insulating layer 115 may be designed according to a predetermined value of the capacitance of the storage capacitor Cst.

A second interlayer insulating layer 117 may be arranged on the second electrode CE2 of the storage capacitor Cst, the source electrode S1, the drain electrode D1, and the driving voltage line PL. The second interlayer insulating layer 117 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$).

An additional conductive layer PL' may be arranged over the second interlayer insulating layer 117. The additional conductive layer PL' may contact the driving voltage line PL or the source electrode S1 of the driving thin-film transistor T1 through a contact hole passing through the second interlayer insulating layer 117. The additional conductive layer PL' may be connected to the driving voltage line PL and may serve as a wiring configured to transfer the driving voltage. At least because the additional conductive layer PL' is provided, a voltage drop of the driving voltage may be prevented, and thus, the overall uniform driving voltage may be provided to the display apparatus.

In the peripheral area PA, the second interlayer insulating layer 117 may cover the edge of the first pad layer 31a and include the second contact hole CNT2 that exposes the central portion of the first pad layer 31a. The second pad layer 31b may be provided to correspond to the second contact hole CNT2. The second pad layer 31b may be formed on the second interlayer insulating layer 117 and may contact the first pad layer 31a through the second contact hole CNT2. The second pad layer 31b may include the same material as the additional conductive layer PL' and may be simultaneously formed with the additional conductive layer PL'. At least because the second pad layer 31b is formed, an electric resistance of the pad 31 may be reduced.

In some embodiments, a top conductive layer may be further arranged on the second interlayer insulating layer 117. The top conductive layer may be spaced apart from the additional conductive layer PL'. The top conductive layer may be connected to conductive layers arranged on the first interlayer insulating layer 115 therebelow. The additional conductive layer PL' may include a conductive material including at least one of molybdenum (Mo), aluminum (Al), copper (Cu), and titanium (Ti), and may include a single layer or a multi-layer. As an example, the additional conductive layer PL' and the second pad layer 31b may include a multi-layered structure of Ti/Cu in which a first layer includes Ti and a second layer includes Cu.

The additional conductive layer PL' and the top conductive layer on the second interlayer insulating layer 117 may be covered by the inorganic protective layer PVX.

The inorganic protective layer PVX may include a single layer or a multi-layer including silicon nitride $SiN_x$ and silicon oxide $SiO_x$. The inorganic protective layer PVX may be introduced to cover and protect some conductive layers or wirings arranged on the second interlayer insulating layer 117. A portion of a conductive layer and/or wirings simultaneously formed with the additional conductive layer PL' during the same process as a process of forming the additional conductive layer PL' may be exposed in a partial region (e.g. a portion of the peripheral area) of the substrate 100. The exposed portion of the conductive layer and/or the wirings may be damaged by etchant used while a pixel electrode 310 described below is patterned. At least because the inorganic protective layer PVX covers at least a portion of the conductive layer and/or the wirings, the wirings may be prevented from being damaged during a process of patterning the pixel electrode 310.

Unlike the first interlayer insulating layer 115 described above, the second interlayer insulating layer 117 may include the same material as the inorganic protective layer PVX. However, for convenience of description, a case where the second interlayer insulating layer 117 is formed in a shape that is the same as or similar to the first interlayer insulating layer 115 is mainly described below.

In addition, a planarization layer 118 including an organic material may be arranged on the inorganic protective layer PVX. When the inorganic protective layer PVX is not arranged, the additional conductive layer PL' may be oxidized or corroded by reacting to oxygen that penetrates into the planarization layer 118. In contrast, in an embodiment, because the inorganic protective layer PVX is introduced, the additional conductive layer PL' may be prevented from directly contacting the planarization layer 118, and thus, the additional conductive layer PL' may be prevented from being oxidized and characteristics of the additional conductive layer PL' may be prevented from being changed.

The inorganic protective layer PVX may include the third contact hole CNT3 corresponding to the pad 31 in the peripheral area PA. For example, the inorganic protective layer PVX may cover the edge of the pad 31 and include the third contact hole CNT3 that exposes the central portion of the pad 31. The contact layer C-PAD may be arranged to correspond to the third contact hole CNT3. In this manner, the lateral surface of the pad 31 according to an embodiment covers the inorganic protective layer PVX, and the central portion of the pad 31 may be covered by the contact layer C-PAD.

At least because the pad 31 may be electrically connected to an external element afterward, the pad 31 may be exposed by removing a portion of the inorganic protective layer PVX. In this case, the pad 31 may be damaged by etchant, etc. used during a subsequent process. The contact layer C-PAD may be prepared to protect the pad 31 from the damage. In addition, the contact layer C-PAD may have conductivity, and thus, serve as a medium electrically connecting the pad 31 to an external terminal.

The contact layer C-PAD may include a conductive oxide, such as at least one of indium tin oxide (ITO), indium zinc oxide (IZO), zinc oxide (ZnO), indium oxide (In$_2$O$_3$), indium gallium oxide (IGO), and aluminum zinc oxide (AZO).

A pad-protecting layer 118a may be arranged on the contact layer C-PAD. In this case, the pad-protecting layer 118a may completely shield the periphery of the contact layer C-PAD from the outside. The pad-protecting layer 118a may reduce etchant penetrating through the contact layer C-PAD or penetrating into the peripheral portion of the contact layer C-PAD while the etchant is used. The pad-protecting layer 118a may include a material that is the same as or similar to that of the planarization layer 118.

The planarization layer 118 may be arranged on the inorganic protective layer PVX in the display area DA. An organic light-emitting diode OLED may be arranged on the planarization layer 118.

The planarization layer 118 may include a single layer or a multi-layer including an organic material and may provide a flat top surface. The planarization layer 118 may include a general-purpose polymer, such as at least one of benzocyclobutene (BCB), polyimide, hexamethyldisiloxane (HMDSO), polymethylmethacrylate (PMMA), and polystyrene (PS), polymer derivatives having a phenol-based group, an acryl-based polymer, an imide-based polymer, an aryl ether-based polymer, an amide-based polymer, a fluorine-based polymer, a p-xylene-based polymer, and a vinyl alcohol-based polymer, or any blend thereof.

The organic light-emitting diode OLED may be arranged on the planarization layer 118 in the display area DA of the substrate 100. The organic light-emitting diode OLED may include the pixel electrode 310, an intermediate layer 320, and an opposite electrode 330. The intermediate layer 320 may include an organic emission layer.

The pixel electrode 310 may include a (semi) transparent electrode or a reflective electrode. In an embodiment, the pixel electrode 310 may include a reflective layer and a transparent or semi-transparent electrode layer on the reflective layer, the reflective layer including at least one of silver (Ag), magnesium (Mg), aluminum (Al), platinum (Pt), palladium (Pd), gold (Au), nickel (Ni), neodymium (Nd), iridium (Ir), chrome (Cr), and a compound thereof. The transparent or semi-transparent electrode layer may include at least one of indium tin oxide (ITO), indium zinc oxide (IZO), zinc oxide (ZnO), indium oxide (In$_2$O$_3$), indium gallium oxide (IGO), and aluminum zinc oxide (AZO). In an embodiment, the pixel electrode 310 may include a multilayer of ITO/Ag/ITO.

A pixel-defining layer 119 may be arranged on the planarization layer 118. The pixel-defining layer 119 may define an emission area of a pixel by including an opening that corresponds to each pixel, e.g., an opening OP that exposes at least the central portion of the pixel electrode 310 in the display area DA. In addition, the pixel-defining layer 119 may prevent an arc, etc., from occurring at the edges of the pixel electrode 310 by increasing a distance between the edges of the pixel electrode 310 and the opposite electrode 330 over the pixel electrode 310.

The pixel-defining layer 119 may include at least one organic insulating material from among polyimide, polyamide, an acrylic resin, benzocyclobutene, and a phenolic resin, and may be formed through spin coating, etc.

The intermediate layer 320 of the organic light-emitting diode OLED may include the organic emission layer. The organic emission layer may include an organic material including a fluorescent or phosphorous material that emits red, green, blue, or white light. The organic emission layer may be a low-molecular weight or polymer organic material. At least one functional layer, such as a hole transport layer (HTL), a hole injection layer (HIL), an electron transport layer (ETL), and an electron injection layer (EIL) may be selectively further arranged under and/or on the organic emission layer. The intermediate layer 320 may correspond to each of a plurality of pixel electrodes 310; however, embodiments are not limited thereto. The intermediate layer 320 may include a layer that is one body over the plurality of pixel electrodes 310; however, various modifications may be made.

The opposite electrode 330 may be a transparent electrode or a reflective electrode. In an embodiment, the opposite electrode 330 may be a transparent electrode or a semi-transparent electrode, and may include a metal thin film having a low work function including at least one of Li, Ca, LiF/Ca, LiF/Al, Al, Ag, Mg, and any compound thereof. In addition, a transparent conductive oxide (TCO) layer may be further arranged on the metal thin film, the TCO layer including at least one of ITO, IZO, ZnO, and In$_2$O$_3$. The opposite electrode 330 may be arranged over the display area DA and the peripheral area PA, and may be arranged on the intermediate layer 320 and the pixel-defining layer 119. The opposite electrode 330 may be formed as one body over a plurality of organic light-emitting diodes OLED to correspond to the plurality of pixel electrodes 310.

A spacer 119S for preventing mask chopping may be further provided to (or on) the pixel-defining layer 119. The spacer 119S may be formed as one body with the pixel-defining layer 119. As an example, the spacer 119S and the pixel-defining layer 119 may be simultaneously formed during the same process using a half-tone mask process.

The pixel electrode 310 may be connected to the drain electrode D1 of the driving thin-film transistor T1 through a connection electrode CM. The connection electrode CM may be arranged between the second interlayer insulating layer 117 and the inorganic protective layer PVX, and may be connected to the drain electrode D1 through a contact hole passing through the second interlayer insulating layer 117. The pixel electrode 310 may be connected to the connection electrode CM through a contact hole passing through the planarization layer 118 and the inorganic protective layer PVX. In this case, the first pad layer 31a may include the same material as the drain electrode D1 and be simultaneously formed with the drain electrode D1. The second pad layer 31b may include the same material as the connection electrode CM and may be simultaneously formed with the connection electrode CM. In addition, the contact layer C-PAD may be formed through a separate process. In another embodiment, the connection electrode CM may be arranged on the inorganic protective layer PVX and may be connected to the drain electrode D1 through a contact hole passing through the second interlayer insulating layer 117 and the inorganic protective layer PVX.

Figure 10:
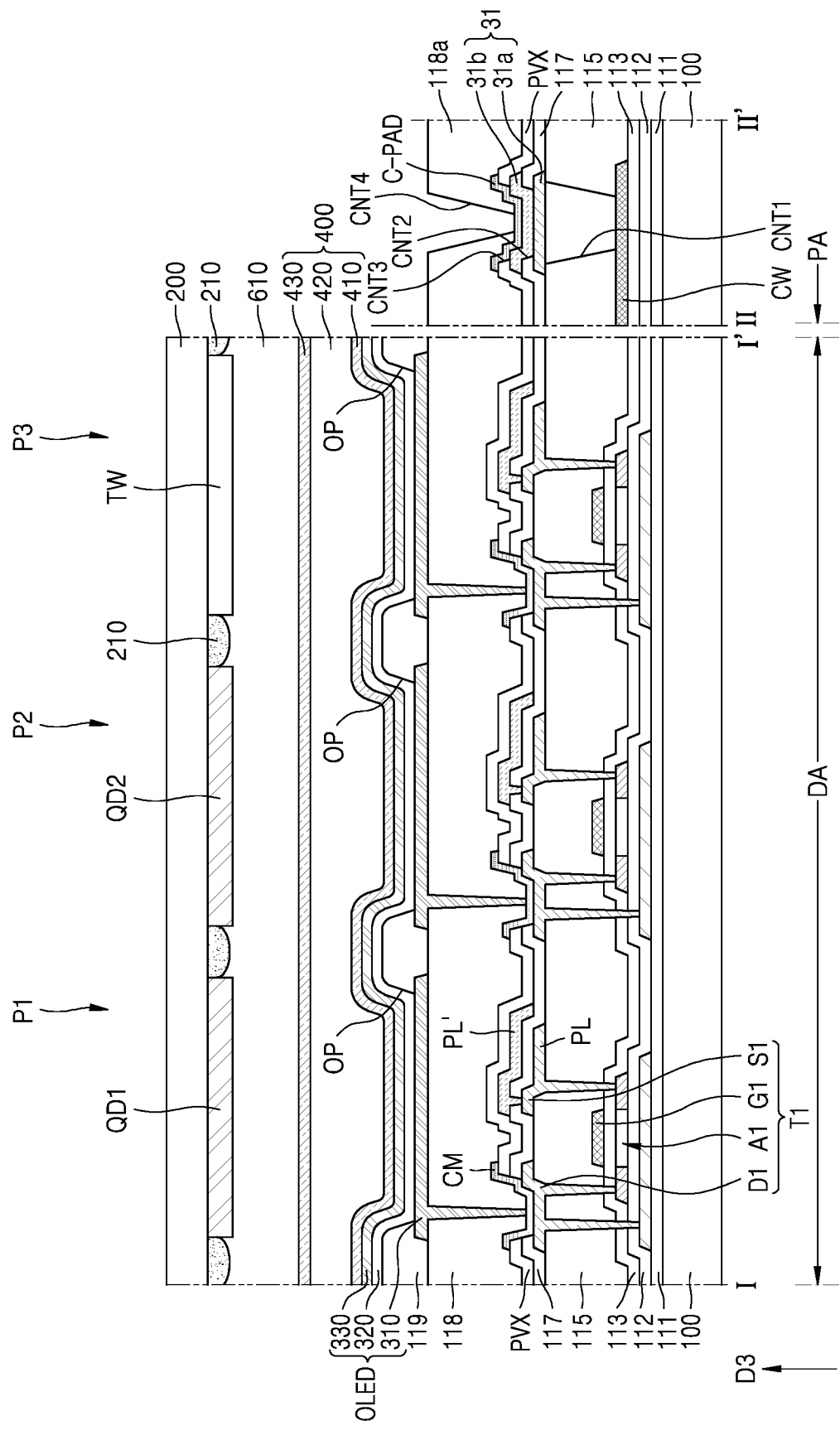
FIG. 10 is a cross-sectional view of a display apparatus according to an embodiment.
Figure 11:
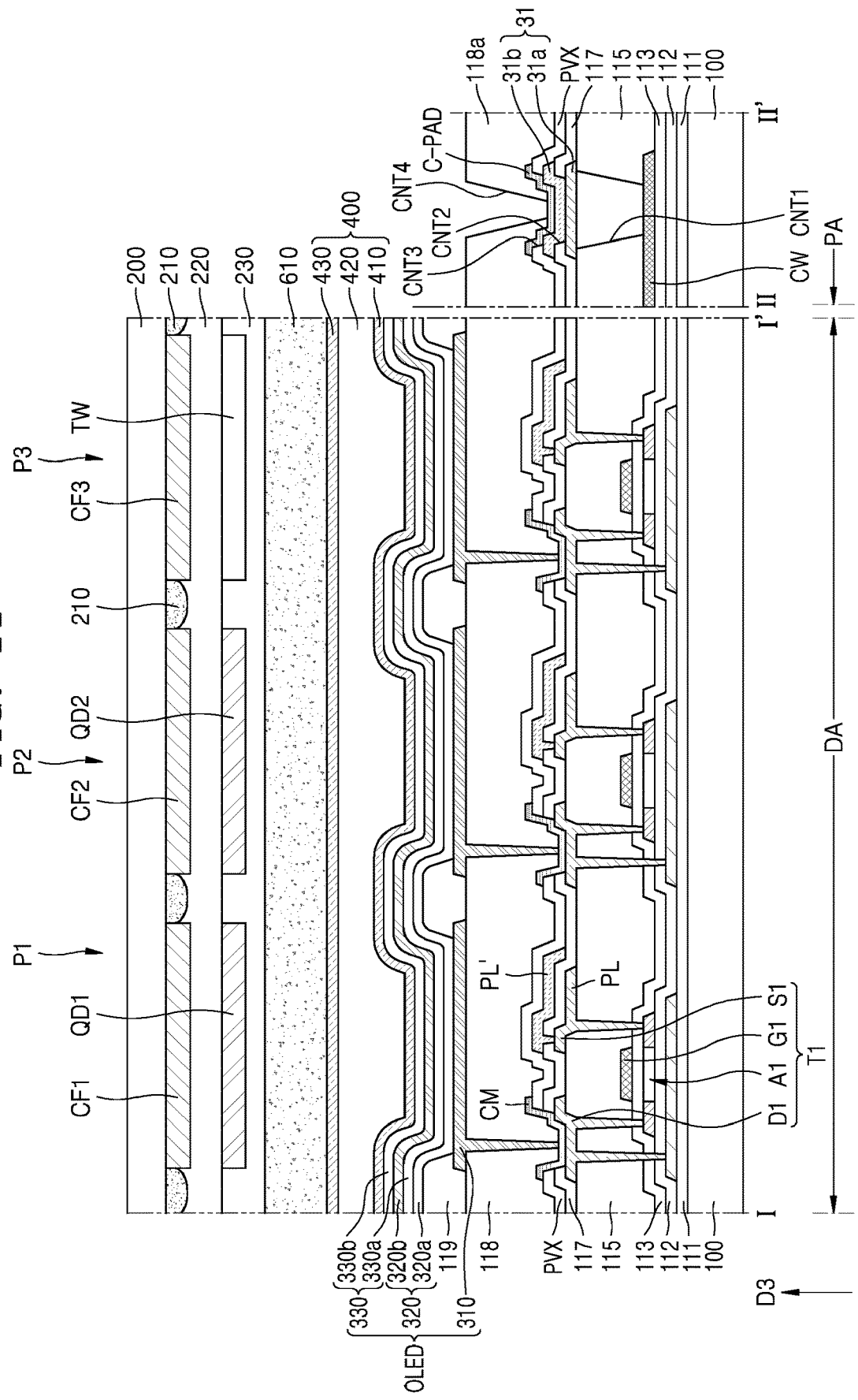
FIG. 11 is a cross-sectional view of a display apparatus according to an embodiment.

The pixel electrode 310 may be connected to the connection electrode CM through a contact hole passing through the planarization layer 118 (see FIGS. 10 and 11). The connection electrode CM may be introduced for preventing damage to the drain electrode D1. The connection electrode CM may include the same material as the contact layer C-PAD and may be simultaneously formed with the contact layer C-PAD. In this case, the first pad layer 31a may include the same material as the drain electrode D1 and may be simultaneously formed with the drain electrode D1. The second pad layer 31b may include the same material as the additional conductive layer PL' and may be simultaneously formed with the additional conductive layer PL'. In another embodiment, two connection electrodes CM may be provided. The two connection electrodes CM may include a first connection electrode and a second connection electrode. The first connection electrode may be arranged on the second interlayer insulating layer 117 and the second connection electrode may be arranged on the inorganic protective layer PVX. In this case, the first connection electrode may be connected to the drain electrode D1 through a contact hole passing through the second interlayer insulating layer 117. The first connection electrode may be connected to the second connection electrode through a contact hole passing through the inorganic protective layer PVX. In addition, the second connection electrode may be connected to the pixel electrode 310 through a contact hole passing through the planarization layer 118. In this case, the first pad layer 31a may include the same material as the drain electrode D1 and may be simultaneously formed with the drain electrode D1. The second pad layer 31b may include the same material as the first connection electrode and the additional conductive layer PL', and may be simultaneously formed with the first connection electrode and the additional conductive layer PL'. In addition, the contact layer C-PAD may include the same material as the second connection electrode and may be simultaneously formed with the second connection electrode.

Hereinafter, for convenience of description, a case is mainly described in which the connection electrode CM is arranged between the second interlayer insulating layer 117 and the inorganic protective layer PVX and is connected to the drain electrode D1 through the contact hole passing through the second interlayer insulating layer 117. In addition, the case is described with respect to the pixel electrode 310 being connected to the connection electrode CM through a contact hole passing through the planarization layer 118 and the inorganic protective layer PVX.

In the case where the pad portion 30 is arranged and the contact layer C-PAD of the pad portion 30 is exposed to the outside, when etchant is used to form the pixel electrode 310, the etchant may influence the first pad layer 31a and the second pad layer 31b, etc. thereunder through the contact layer C-PAD. For example, at least because the etchant flows into a space between the contact layer C-PAD and the inorganic protective layer PVX at the end portion of the contact layer C-PAD, the etchant may erode the first pad layer 31a and the second pad layer 31b.

In contrast, in the case where the pad-protecting layer 118a is arranged at the periphery of the contact layer C-PAD, the etchant may be prevented from flowing to the periphery of the contact layer C-PAD. Accordingly, the display apparatus may be configured to prevent the pad portion 30 from malfunctioning by preventing the first pad layer 31a and the second pad layer 31b from being eroded. In addition, the display apparatus may be configured to prevent a short-circuit of the first pad layer 31a and the second pad layer 31b from occurring by preventing erosion of the first pad layer 31a and the second pad layer 31b.

Figure 4A:
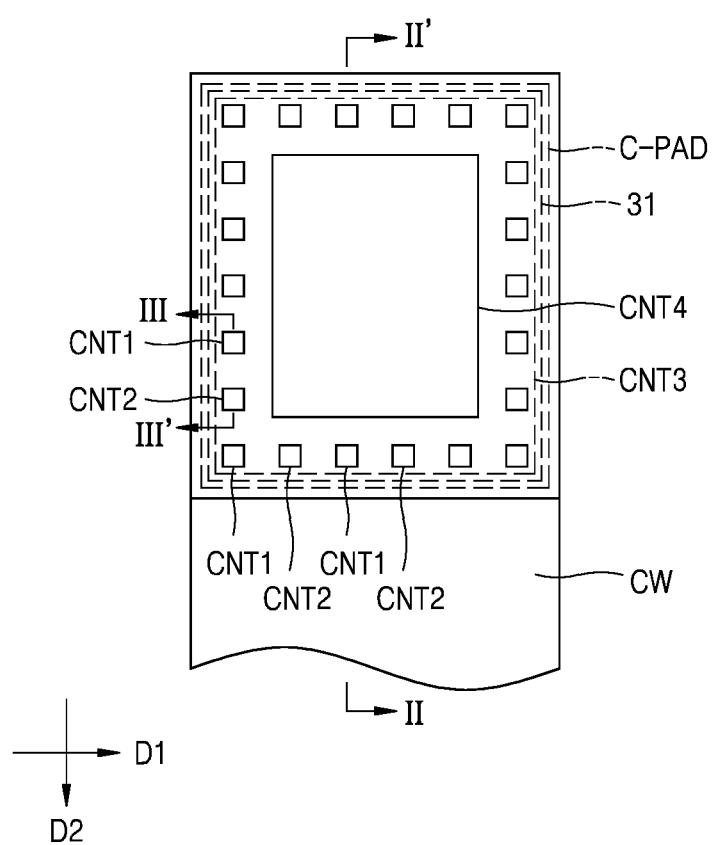
FIG. 4A is a plan view of a pad of a display apparatus according to an embodiment.
Figure 4B:
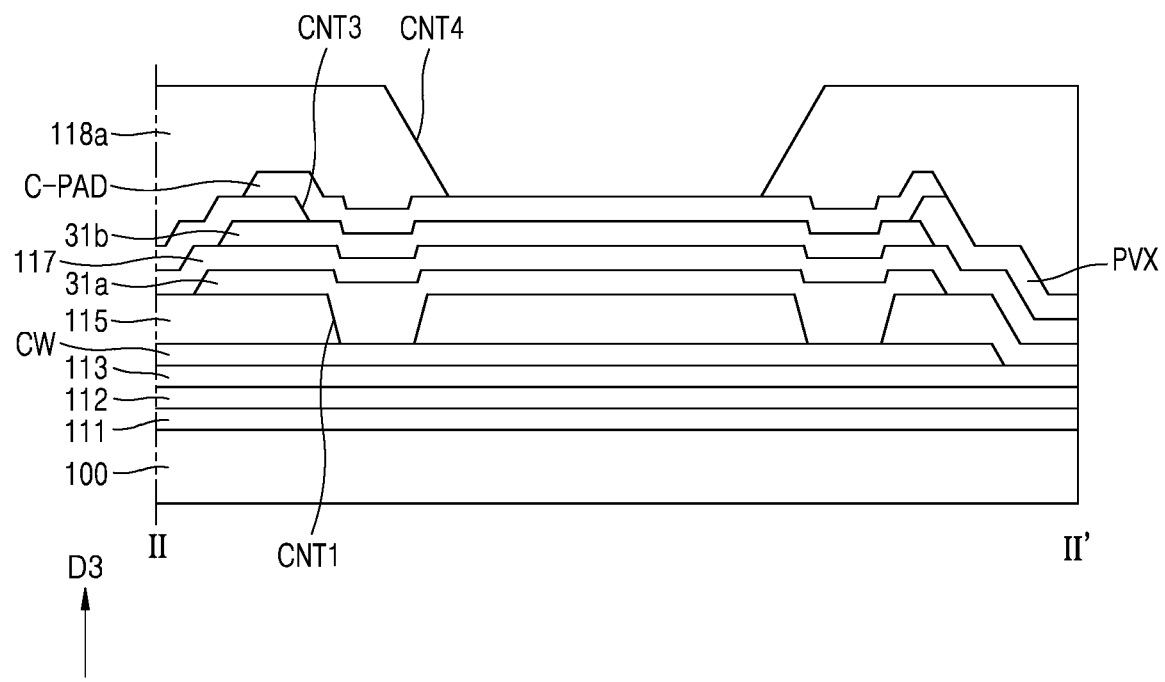
FIG. 4B is a cross-sectional view of the pad of FIG. 4A taken along sectional line II-II' according to an embodiment.
Figure 4C:
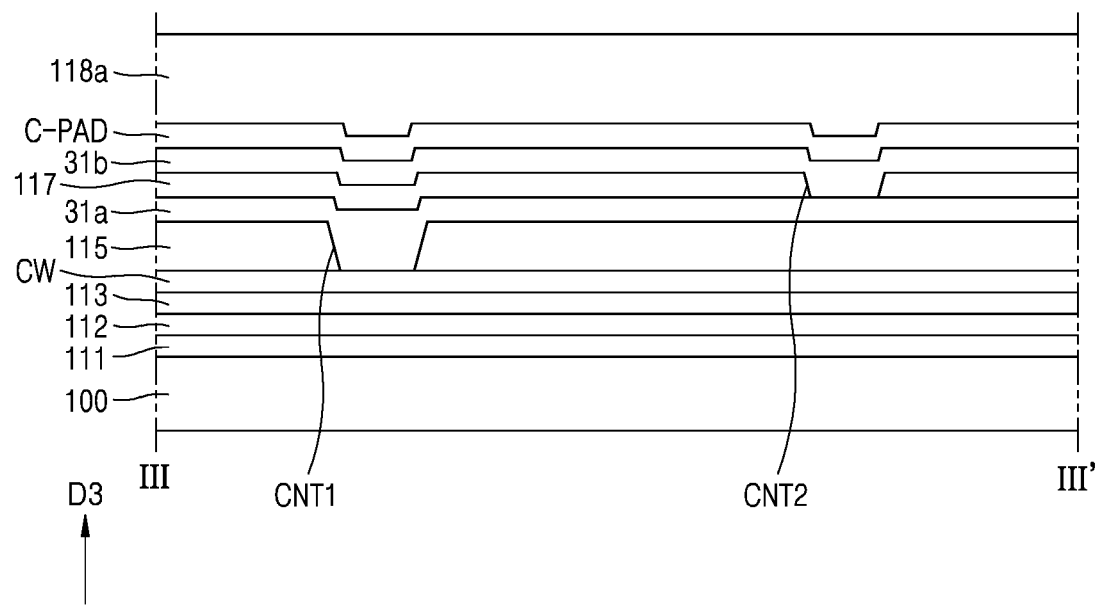
FIG. 4C is a cross-sectional view of the pad of FIG. 4A taken along sectional line according to an embodiment.

FIG. 4A is a plan view of a pad of a display apparatus according to an embodiment. FIG. 4B is a cross-sectional view of the pad of FIG. 4A taken along sectional line according to an embodiment. FIG. 4C is a cross-sectional view of the pad of FIG. 4A taken along sectional line of FIG. 4A according to an embodiment.

Referring to FIGS. 4A to 4C, a display apparatus according to an embodiment includes the pad 31 in the peripheral area PA. The edge of the pad 31 may be covered by the second interlayer insulating layer 117 and/or the inorganic protective layer PVX. The central portion of the pad 31 may be covered by the contact layer C-PAD.

In an embodiment, the pad 31 may include the first pad layer 31a and the second pad layer 31b. The first pad layer 31a may be connected to the connection wiring CW through the first contact hole CNT1 passing through the first interlayer insulating layer 115. In this case, the first contact hole CNT1 may be arranged on the edge of the pad 31 and not the central portion of the pad 31. As an example, the central line of the first contact hole CNT1 parallel to a height direction of the pad 31 may be spaced apart by a predetermined distance from a central line of the first pad layer 31a parallel to a height direction of the pad 31. In this case, the first contact hole CNT1 may be provided as part of a plurality of first contact holes CNT1. The plurality of first contact holes CNT1 may be spaced apart from each other to surround the center of the first pad layer 31a. As an example, the plurality of first contact holes CNT1 may be arranged along the periphery of the pad 31 to be spaced apart from each other by a predetermined distance. The edge of the first pad layer 31a may be covered by the second interlayer insulating layer 117 and the inorganic protective layer PVX.

The second pad layer 31b may be arranged on the second interlayer insulating layer 117. In this case, the second pad layer 31b may be connected to the first pad layer 31a through the second contact hole CNT2. The second contact hole CNT2 may neighbor the first contact hole CNT1. In this case, the second contact hole CNT2 may be provided in a plurality of second contact holes CNT2. The plurality of second contact holes CNT2 may be arranged similar to the plurality of first contact holes CNT1. In this case, each first contact hole CNT1 and each second contact hole CNT2 may be alternately arranged. In this case, the plurality of first contact holes CNT1 and the plurality of second contact holes CNT2 may be arranged in an outer area (or a peripheral area) excluding the central area of the pad 31. In this case, the plurality of first contact holes CNT1 and the plurality of second contact holes CNT2 may be arranged in a line or a zigzag shape or arrangement.

As described above, the pad-protecting layer 118a may be arranged in a region where the first contact hole CNT1 and the second contact hole CNT2 are arranged. In this case, the pad-protecting layer 118a may shield even a portion of the central region of the pad 31 in a plan view.

The central region of the second pad layer 31b may be covered by the contact layer C-PAD. The contact layer C-PAD may be arranged inside the third contact hole CNT3 of the inorganic protective layer PVX to directly contact the top surface of the second pad layer 31b. A portion of the contact layer C-PAD may extend to the top surface of the inorganic protective layer PVX.

The first pad layer 31a may include metal having relatively excellent electric conductivity. As an example, the first pad layer 31a may include copper (Cu). In an embodiment, the first pad layer 31a may include a structure of Ti/Cu in which a first layer includes Ti and a second layer includes Cu. The material constituting the second layer of the first pad layer 31a may have a relatively high oxidation degree and may be easily damaged by etchant during a process.

The contact layer C-PAD may include oxidation as described above.

In an embodiment, because the edge of the pad 31 is covered by the pad-protecting layer 118a, and the central portion of the pad 31 is covered by the contact layer C-PAD, damage to the pad 31 due to etchant during a process may be reduced and oxidation may be prevented.

For example, at least because the pad-protecting layer 118a covers the periphery (or the edge) of the contact layer C-PAD, and inflow of etchant between the contact layer C-PAD and the inorganic protective layer PVX is prevented, damage to the pad 31 may be reduced. In this case, the fourth contact hole CNT4 may be formed in the pad-protecting layer 118a to expose a portion of the contact layer C-PAD to the outside.

Figure 5A:
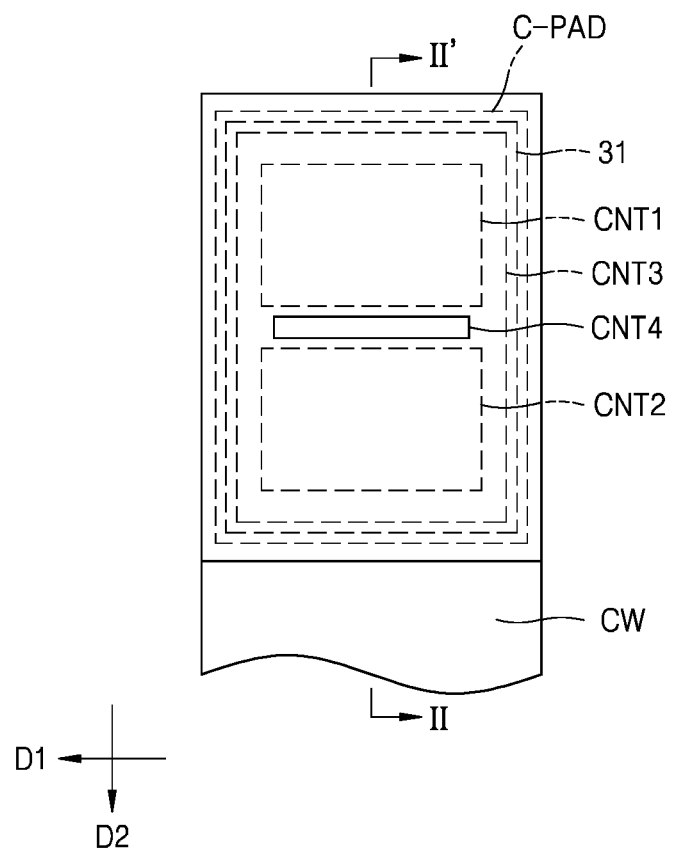
FIG. 5A is a plan view of a pad of a display apparatus according to an embodiment.
Figure 5B:
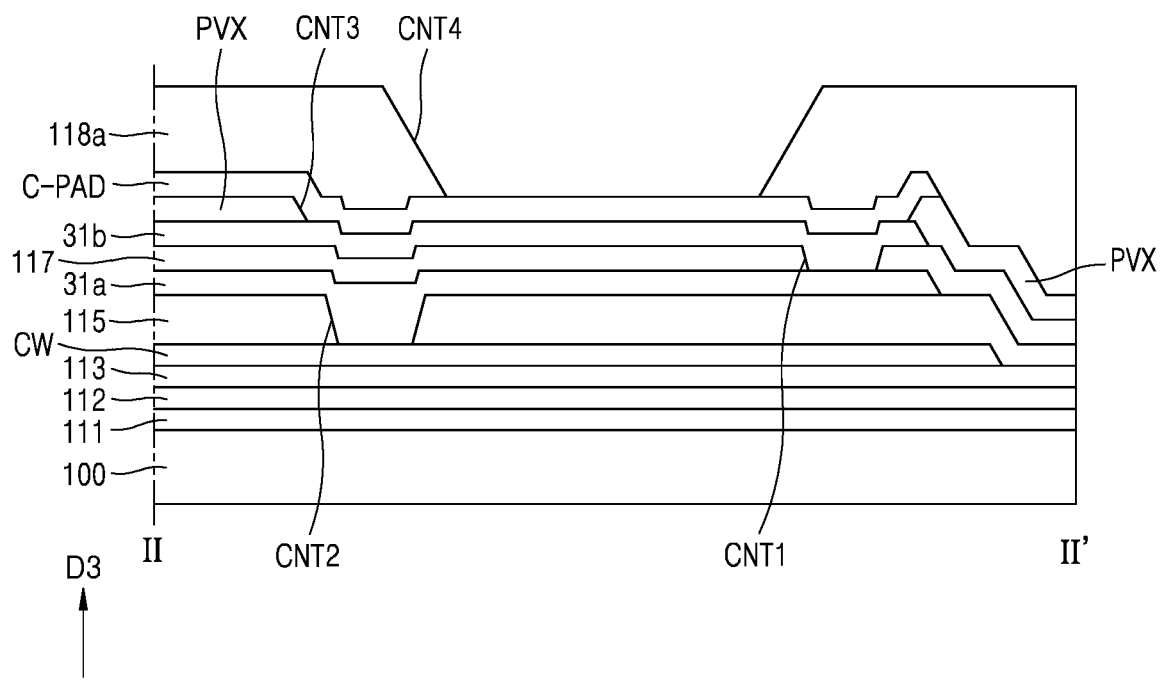
FIG. 5B is a cross-sectional view of the pad of FIG. 5A taken along sectional line II-II' according to an embodiment.

FIG. 5A is a plan view of a pad of a display apparatus according to an embodiment. FIG. 5B is a cross-sectional view of the pad of FIG. 5A taken along sectional line according to an embodiment. In FIGS. 5A and 5B, the same reference numerals as those in FIG. 3 denote the same elements, and thus, repeated descriptions thereof are omitted.

Referring to FIGS. 5A and 5B, a display apparatus according to an embodiment includes the pad 31 in the peripheral area PA. The edge of the pad 31 is covered by the pad-protecting layer 118a. The central portion of the pad 31 may be covered by the contact layer C-PAD.

In an embodiment, the pad 31 may include the first pad layer 31a and the second pad layer 31b. The first pad layer 31a may be connected to the connection wiring CW through the first contact hole CNT1 passing through the first interlayer insulating layer 115. In a plan view, the first contact hole CNT1 is not arranged at the center of the pad 31 and may be arranged at a position eccentric from the center of the planar shape of the pad 31. As an example, in a plan view, the center of the planar shape of the pad 31 may not be arranged inside the planar shape of the first contact hole CNT1, or the center of the planar shape of the first contact hole CNT1 may not coincide with the center of the planar shape of the pad 31.

The edge of the first pad layer 31a may be covered by the second interlayer insulating layer 117. In this case, the second pad layer 31b may be arranged on the second interlayer insulating layer 117 and connected to the first pad layer 31a through the second contact hole CNT2. In this case, the planar shape of the first contact hole CNT1 may not overlap the planar shape of the second contact hole CNT2 in a plan view. For example, in a plan view, the planar shape of the first contact hole CNT1 may be spaced apart from the planar shape of the second contact hole CNT2.

The contact layer C-PAD may be arranged on the inorganic protective layer PVX and may be connected to the second pad layer 31b through the third contact hole CNT3. In this case, the pad-protecting layer 118a may be arranged on the contact layer C-PAD. The pad-protecting layer 118a may include the fourth contact hole CNT4 that exposes a portion of the contact layer C-PAD to the outside.

At least one of the first pad layer 31a and the second pad layer 31b may include metal having relatively excellent electrical conductivity. As an example, the first pad layer 31a may include copper (Cu). In an embodiment, the first pad layer 31a may include a structure of Ti/Cu in which a first layer includes Ti and a second layer includes Cu. The material constituting the second layer of the first pad layer 31a may have a relatively high oxidation degree and may be easily damaged by etchant during a process.

The contact layer C-PAD may include oxidation as described above.

In an embodiment, at least because the lateral surface of the pad 31 is covered by the pad-protecting layer 118a, and the central portion of the pad 31 is covered by the contact layer C-PAD, damage to the pad 31 due to etchant during a process may be reduced and oxidation may be prevented.

Figure 6:
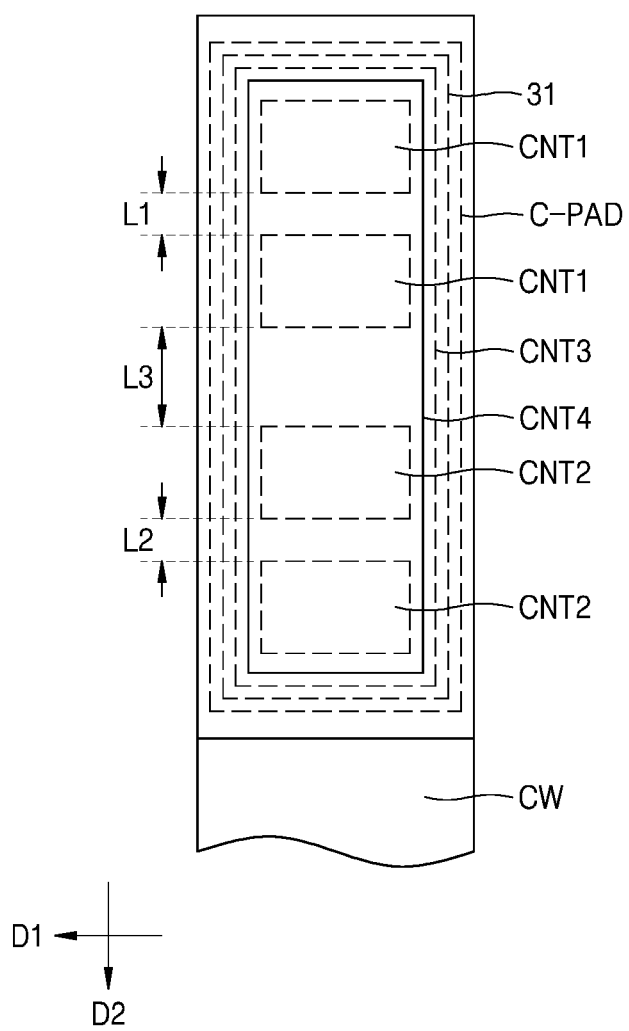
FIG. 6 is a plan view of a pad of a display apparatus according to an embodiment.

FIG. 6 is a plan view of a pad of a display apparatus according to an embodiment.

Referring to FIG. 6, in the pad 31, the first contact hole CNT1 connecting the connection wiring CW to the first pad layer 31a, and the second contact hole CNT2 connecting the first pad layer 31a to the second pad layer 31b may be arranged in various shapes. As an example, each of the first contact hole CNT1 and the second contact hole CNT2 may be provided as one of a plurality. The plurality of first contact holes CNT1 and the plurality of second contact holes CNT2 may each be arranged in a line. In this case, a first distance L1 between the planar shapes of the first contact holes CNT1 neighboring each other may be constant over the plurality of first contact holes CNT1. As an example, the first distance L1 may be 40 μm or more.

In addition, a second distance L2 between the planar shapes of the second contact holes CNT2 neighboring each other may be constant over the plurality of second contact holes CNT2. As an example, the second distance L2 may be 40 μm or more. In this case, the first distance L1 and the second distance L2 may denote a vertical distance between sides of different contact holes facing each other in the planar shapes of the contact holes neighboring each other.

A third distance L3 between the planar shape of the first contact hole CNT1 and the planar shape of the second contact hole CNT2 may be different from the first distance L1 and the second distance L2. As an example, the third distance L3 may be greater than the first distance L1 and the second distance L2.

The contact layer C-PAD may be arranged on the second pad layer 31b. In this case, the planar shape of the contact layer C-PAD may be nearly the same as or greater than the planar shape of the second pad layer 31b. In this case, the pad-protecting layer 118a may be arranged on the contact layer C-PAD. At least because the contact layer C-PAD and the pad-protecting layer 118a are the same as or similar to those described above, detailed descriptions thereof are omitted.

The pad-protecting layer 118a may be arranged on the contact layer C-PAD. The fourth contact hole CNT4 may be arranged in the pad-protecting layer 118a to expose the contact layer C-PAD to the outside. In this case, an external element, etc., may be connected to the contact layer C-PAD through the fourth contact hole CNT4.

The pad-protecting layer 118a may cover the periphery of the contact layer C-PAD. In this case, the pad-protecting layer 118a may be arranged to cover the entire periphery of the contact layer C-PAD. In this case, the pad-protecting layer 118a may prevent etchant for etching the pixel electrode 310 from penetrating between the contact layer C-PAD and the inorganic protective layer PVX.

The pad 31 may have a shape similar to those shown in FIGS. 4B, 4C, and 5B in which respective layers are stacked, but relative to the plan view shown in FIG. 6.

Figure 7:
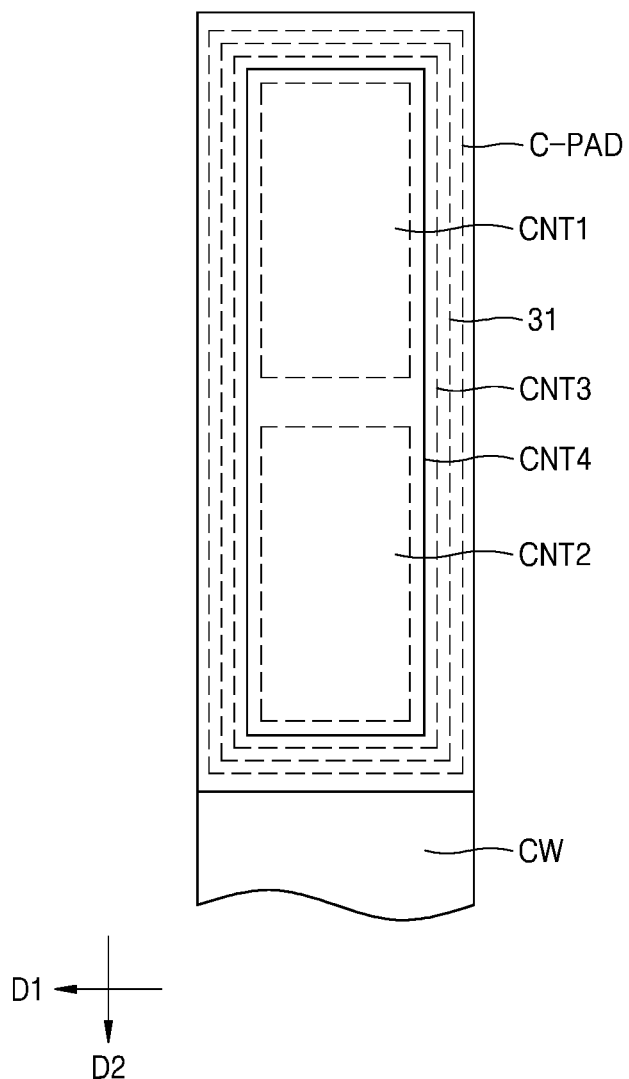
FIG. 7 is a plan view of a pad of a display apparatus according to an embodiment.

FIG. 7 is a plan view of a pad of a display apparatus according to an embodiment.

Referring to FIG. 7, the pad 31 may include a first pad layer and a second pad layer. In this case, the first pad layer and the second pad layer are the same as or similar to those described above, and thus, descriptions thereof are omitted.

The first pad layer may be connected to the connection wiring CW through the first contact hole CNT1. In this case, the first contact hole CNT1 may have a rectangular planar shape. In addition, the planar shape of the first contact hole CNT1 may be arranged in a portion spaced apart from the center of the pad 31.

The first pad layer may be connected to the second pad layer through the second contact hole CNT2. In this case, similar to the first contact hole CNT1, the second contact hole CNT2 may be arranged in a portion spaced apart from the center of the pad 31. The first contact hole CNT1 and the second contact hole CNT2 may be respectively arranged at positions symmetrical to each other with respect to the center of the pad 31.

The first pad layer may be arranged on a first interlayer insulating layer, and a second pad layer may be arranged on the second interlayer insulating layer. In addition, a planarization layer may be arranged on the second pad layer 31b, and the contact layer C-PAD may be arranged on the planarization layer. In this case, the contact layer C-PAD may be connected to the second pad layer through the third contact hole CNT3. The pad-protecting layer 118a may be arranged on the contact layer C-PAD. For instance, the pad-protecting layer 118a may cover the top surface of the periphery of the contact layer C-PAD.

According to various embodiments, the pad-protecting layer 118a may prevent etchant from penetrating into a space between the contact layer C-PAD and the inorganic protective layer, thereby preventing at least one of the first pad layer and the second pad layer from being damaged or oxidized by the etchant.

The pad 31 may have a shape similar to those shown in FIGS. 4B, 4C, and 5B in which respective layers are stacked, but relative to the plan view shown in FIG. 7.

Figure 8:
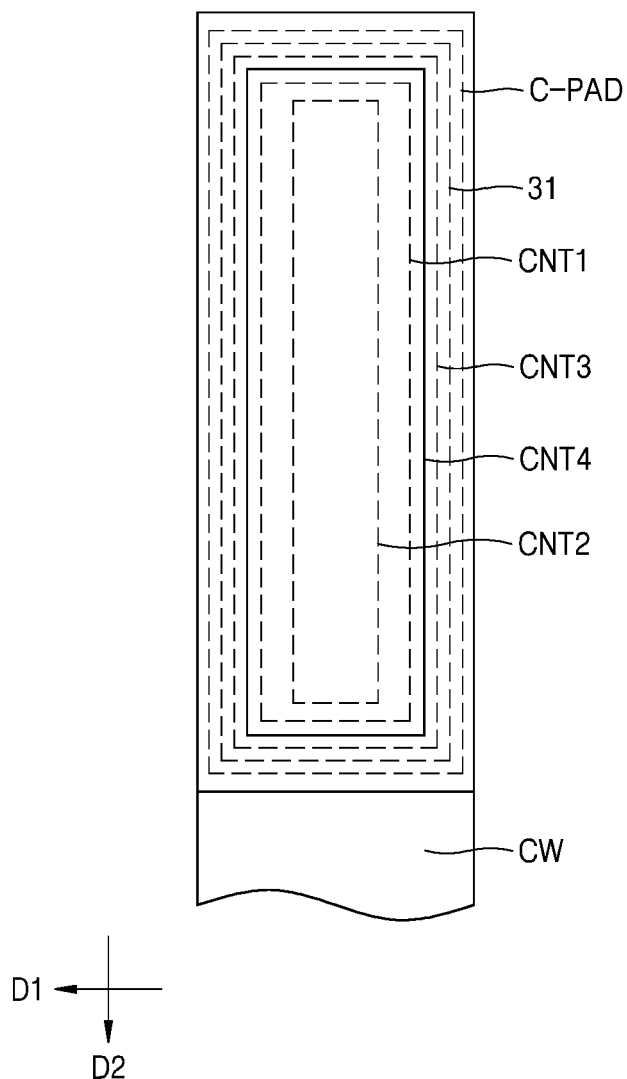
FIG. 8 is a plan view of a pad of a display apparatus according to an embodiment.

FIG. 8 is a plan view of a pad of a display apparatus according to an embodiment.

Referring to FIG. 8, the pad 31 may include a first pad layer and a second pad layer. In this case, the first pad layer and the second pad layer are the same as or similar to those described above, and thus, descriptions thereof are omitted.

The first pad layer may be arranged on a first interlayer insulating layer, and the second pad layer may be arranged on the second interlayer insulating layer. In addition, a planarization layer may be arranged on the second pad layer 31b, and the contact layer C-PAD may be arranged on the planarization layer. The connection wiring CW may be connected to the first pad layer through the first contact hole CNT1. The first pad layer may be connected to the second pad layer through the second contact hole CNT2. In addition, the contact layer C-PAD may be connected to the second pad layer through the third contact hole CNT3. In this case, the pad-protecting layer 118a may be arranged on the contact layer C-PAD. For example, the pad-al protecting layer 118a may be arranged to cover the top surface of the periphery of the contact layer C-PAD.

According to some embodiments, the planar shape of the first contact hole CNT1 may surround the planar shape of the second contact hole CNT2. In this case, the planar shape of the first contact hole CNT1 and the planar shape of the second contact hole CNT2 may each have a rectangular shape. The center of the planar shape of the first contact hole CNT1 may coincide with the center of the planar shape of the second contact hole CNT2. In this case, in a plan view, the contact layer C-PAD may completely cover the first contact hole CNT1 and the second contact hole CNT2. Further, the planar shape of the first contact hole CNT1 and the planar shape of the second contact hole CNT2 may be arranged inside the planar shape of the third contact hole CNT3. The pad-protecting layer 118a may be arranged on the contact layer C-PAD. In this case, the pad-protecting layer 118a may cover the edge portion of the contact layer C-PAD.

According to various embodiments, etchant used while a pixel electrode 310 is etched may be prevented from penetrating between the contact layer C-PAD and the inorganic insulating layer.

The pad 31 may have a shape similar to those shown in FIGS. 4B, 4C, and 5B in which respective layers are stacked, but relative to the plan view shown in FIG. 8.

Figure 9:
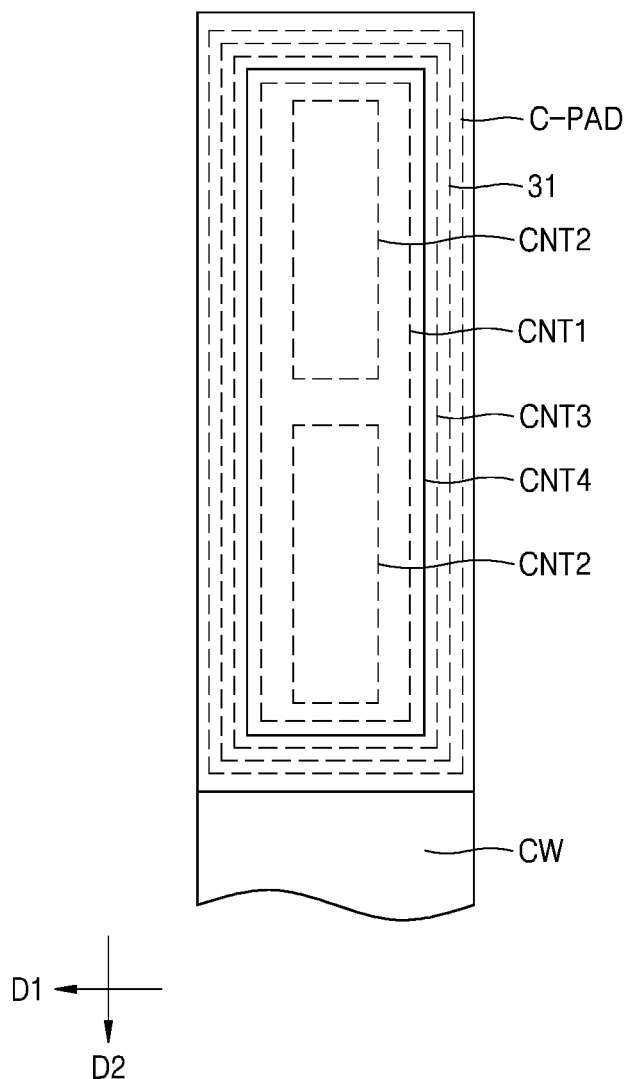
FIG. 9 is a plan view of a pad of a display apparatus according to an embodiment.

FIG. 9 is a plan view of a pad of a display apparatus according to an embodiment.

Referring to FIG. 9, the pad 31 may include a first pad layer and a second pad layer. In this case, the first pad layer and the second pad layer are the same as or similar to those described above, and thus, descriptions thereof are omitted.

The first pad layer may be arranged on a first interlayer insulating layer, and the second pad layer may be arranged on a second interlayer insulating layer. In addition, a planarization layer may be arranged on the second pad layer 31b, and the contact layer C-PAD may be arranged on the planarization layer. In this case, the connection wiring CW may be connected to the first pad layer through the first contact hole CNT1. The first pad layer may be connected to the second pad layer through the second contact hole CNT2. In addition, the contact layer C-PAD may be connected to the second pad layer through the third contact hole CNT3. The pad-protecting layer 118a may be arranged on the contact layer C-PAD. For example, the pad-protecting layer 118a may cover the top surface of the periphery of the contact layer C-PAD.

According to various embodiments, the second contact hole CNT2 may be provided in a plurality of second contract holes CNT2. The plurality of second contact holes CNT2 may overlap the first contact hole CNT1. For instance, in a plan view, all of the planar shapes of the second contact holes CNT2 may be arranged inside the planar shape of the first contact hole CNT1. In this case, the plurality of second contact holes CNT2 may be arranged to be spaced apart from each other inside the planar shape of the first contact hole CNT1 in a plan view. The second pad layer may be arranged on the plurality of second contact holes CNT2. One second pad layer may be provided and connected to the first pad layer through the plurality of second contact holes CNT2. The second pad layer may be connected to the contact layer C-PAD as described above, and a portion of the contact layer C-PAD may be covered by the pad-protecting layer 118a. For example, the pad-protecting layer 118a may be arranged on the contact layer C-PAD to cover the peripheral portion of the contact layer C-PAD.

In various embodiments, the pad-protecting layer 118a may prevent etchant from being introduced to the lateral surface of the contact layer C-PAD.

The pad 31 may have a shape similar to those shown in FIGS. 4B, 4C, and 5B in which respective layers are stacked, but relatively to the plan view shown in FIG. 9.

FIG. 10 is a plan view of a pad of a display apparatus according to an embodiment. In FIG. 10, the same reference numerals as those in FIG. 3 denote the same elements, and thus, repeated descriptions thereof are omitted.

Referring to FIG. 10, a display apparatus according to an embodiment includes a plurality of pixels P1, P2, and P3 arranged in a display area DA, a thin-film encapsulation layer 400 covering the plurality of pixels P1, P2, and P3, color-converting layers (e.g., first and second color-converting layers QD1 and QD2), a light-blocking pattern 210 over the thin-film encapsulation layer 400, and a top substrate 200.

In an embodiment, an intermediate layer 320 of organic light-emitting diodes OLED respectively arranged in the pixels P1, P2, and P3 may be provided in common. As such, respective organic light-emitting diodes OLED included in each of the pixels P1, P2, and P3 may emit light having the same color. As an example, the intermediate layer 320 may include an organic emission layer including a fluorescent or phosphorous material that emits blue light. At least one functional layer, such as at least one of a hole transport layer (HTL), a hole injection layer (HIL), an electron transport layer (ETL), and an electron injection layer (EIL), may be selectively further arranged under and/or on the organic emission layer.

At least because the organic light-emitting diode OLED may be easily damaged by moisture or oxygen, etc., from the outside, the organic light-emitting diode OLED may be covered and protected by the thin-film encapsulation layer 400. The thin-film encapsulation layer 400 may cover the display area DA and extend to the outside of the display area DA. The thin-film encapsulation layer 400 may include at least one organic encapsulation layer and at least one inorganic encapsulation layer. As an example, the thin-film encapsulation layer 400 may include a first inorganic encapsulation layer 410, an organic encapsulation layer 420, and a second inorganic encapsulation layer 430.

The first inorganic encapsulation layer 410 may cover the opposite electrode 330 and include at least one of silicon oxide, silicon nitride, and silicon oxynitride. In some embodiments, other layers, such as a capping layer, may be arranged between the first inorganic encapsulation layer 410 and the opposite electrode 330 when needed or desired. At least because the first inorganic encapsulation layer 410 is formed along a structure thereunder, the top surface of the first inorganic encapsulation layer 410 is not flat. The organic encapsulation layer 420 may cover the first inorganic encapsulation layer 410. Unlike the first inorganic encapsulation layer 410, the top surface of the organic encapsulation layer 420 may be approximately flat. As an example, the top surface of a portion of the organic encapsulation layer 420 that corresponds to the display area DA may be approximately flat. The organic encapsulation layer 420 may include at least one of polyethylene terephthalate, polyethylene naphthalate, polycarbonate, polyimide, polyethylene sulfonate, polyoxymethylene, polyarylate, and hexamethyldisiloxane. The second inorganic encapsulation layer 430 may cover the organic encapsulation layer 420 and include at least one of silicon oxide, silicon nitride, and silicon oxynitride.

Even when cracks occur inside the thin-film encapsulation layer 400, the cracks may not be connected between the first inorganic encapsulation layer 410 and the organic encapsulation layer 420 or between the organic encapsulation layer 420 and the second inorganic encapsulation layer 430 through the above multi-layered structure. With this configuration, formation of a path through which external moisture or oxygen penetrates into the display area DA may be prevented or minimized.

The top substrate 200 may be arranged over the thin-film encapsulation layer 400. The top substrate 200 may face the substrate 100. The color-converting layers, e.g., the first and second color-converting layers QD1 and QD2, a transmissive window TW, and the light-blocking pattern 210 may be arranged on the top substrate 200.

The color-converting layers, e.g., the first and second color-converting layers QD1 and QD2, may enhance the color of light emitted from the organic light-emitting diode OLED or convert the color into another color. The color-converting layers, e.g., the first and second color-converting layers QD1 and QD2, may include a quantum conversion layer including quantum dots and/or the like. A quantum dot is a semiconductor particle having a diameter of about 2 nm to about 10 nm and unique electrical and optical characteristics. When exposed to light, a quantum dot may emit light in a specific frequency depending on the size of the particle and its kind of material. As an example, when receiving light, a quantum dot may emit red, green, or blue light depending on the size of the particle and/or its kind of material. [0177] The core of the quantum dot may include one of a group II-VI compound, a group III-V compound, a group IV-VI compound, a group IV element, a group IV compound, and/or combinations thereof.

A group II-VI compound may include at least one of: a two-element compound including at least one of CdSe, CdTe, ZnS, ZnSe, ZnTe, ZnO, HgS, HgSe, HgTe, MgSe, MgS, and a mixture thereof; a three-element compound including at least one of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound including at least one of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

A group III-V compound may include at least one of: a two-element compound including at least one of GaN, GaP, GaAs, GaSb, MN, AlP, AlAs, AlSb, InN, InP, InAs, InSb, and a mixture thereof; a three-element compound including at least one of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound including at least one of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

A group IV-VI compound may include at least one of: a two-element compound including at least one of SnS, SnSe, SnTe, PbS, PbSe, PbTe, and a mixture thereof; a three-element compound including at least one of SnSeS, SnSeTe, SnSTe, PbSeS, PbSeTe, PbSTe, SnPbS, SnPbSe, SnPbTe, and a mixture thereof; and a four-element compound including at least one of SnPbSSe, SnPbSeTe, SnPbSTe, and a mixture thereof. A group IV element may include one of Si, Ge, and a mixture thereof. A group IV compound may include a two-element compound including one of SiC, SiGe, and a mixture thereof.

In this case, the two-element compound, the three-element compound, or the four-element compound may be present inside a particle at a uniform concentration, or may be divided into states with partially different concentration distributions and present in the same particle. In addition, a core-shell structure in which one quantum dot surrounds another quantum dot may be provided. An interface between the core and the shell may have a concentration gradient in which the concentration of an element existing in the shell reduces toward the center.

In an embodiment, a quantum dot may have a core-shell structure including a core and a shell. The core may include a nano crystal and the shell may surround the core. The shell of a quantum dot may serve as a protective layer that prevents a chemical change of the core to maintain a semiconductor characteristic and/or to serve as a charging layer for giving an electrophoretic characteristic to the quantum dot. The shell may include a single layer or a multi-layer. An interface between the core and the shell may have a concentration gradient in which the concentration of an element existing in the shell reduces toward the center. Examples of the shell of the quantum dot include oxide of metal or non-metal, a semiconductor compound, or a combination thereof.

As an example, although the oxide of metal or non-metal may include a two-element compounding including at least one of $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a three-element compound including at least one of $MgAl_2O_4$, $CoFe_2O_4$, $NiFe_2O_4$, and $CoMn_2O_4$, embodiments are not limited thereto.

In addition, although the semiconductor compound may include at least one of CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, embodiments are not limited thereto.

A quantum dot may have a full width at half maximum (FWHM) of a light emission wavelength spectrum of 45 nm or less, e.g., about 40 nm or less, such as, about 30 nm or less. In this range, color purity or color reproduction may be improved. In addition, since light emitted from the quantum dot is emitted in all directions, a viewing angle of light may be improved.

In addition, although the shape of the quantum dot may be a shape generally used in the art and is not particularly limited, the shape of the quantum dot may include a spherical shape, a pyramid shape, a multi-arm shape, or a cubic nano particle, a nano tube, a nano wire, a nano fiber, and/or a nano plate particle in some embodiments.

The color-converting layers, e.g., the first and second color-converting layers QD1 and QD2, may be arranged to correspond to at least a portion of an emission area defined by the opening OP of the pixel-defining layer 119. As an example, the first color-converting layer QD1 may correspond to an emission area of a first pixel P1, and the second color-converting layer QD2 may correspond to an emission area of a second pixel P2. A color-converting layer may not correspond to an emission area of a third pixel P3. The transmissive window TW may be arranged in the emission area of the third pixel P3. The transmissive window TW may include an organic material that may emit light without converting the wavelength of light emitted from the organic light-emitting diode OLED; however, embodiments are not limited thereto. The color-converting layer may also be arranged in the emission area of the third pixel P3.

Scattering particles may be distributed in the color-converting layers, e.g., the first and second color-converting layers QD1 and QD2, and the transmissive window TW. As such, color spreading may be uniform or substantially uniform.

The light-blocking pattern 210 may be arranged between the color-converting layers, e.g., the first and second color-converting layers QD1 and QD2, and the transmissive window TW. The light-blocking pattern 210 may be a black matrix and may be a member configured to improve color clarity and contrast. The light-blocking pattern 210 may be arranged between the emission areas of the pixels, e.g., the first pixel P1, the second pixel P2, and the third pixel P3. The light-blocking pattern 210 may include a black matrix that absorbs a visible ray, and thus, prevent color mixing of light emitted from the emission areas of neighboring pixels and improve visibility and contrast.

In an embodiment, the plurality of organic light-emitting diodes OLED may emit blue light. In this case, the first color-converting layer QD1 may include quantum dots that emit red light, and the second color-converting layer QD2 may include quantum dots that emit green light. Accordingly, light emitted to the outside of the display apparatus may be red, green, or blue color. Various color expressions may be possible through combinations of these colors.

A filling material 610 may be further arranged between the substrate 100 and the top substrate 200. The filling material 610 may perform a buffering function against external pressure, etc. The filling material 610 may include an organic material, such as at least one of methyl silicon, phenyl silicon, and polyimide; however, embodiments are not limited thereto. For instance, the filling material 610 may include at least one of a urethane resin, an epoxy-based resin, an acryl-based resin, which are organic sealants, and silicon, which is inorganic sealant.

FIG. 11 is a cross-sectional view of a display apparatus according to an embodiment. In FIG. 11, the same reference numerals as those of FIG. 10 denote the same elements, and thus, repeated descriptions thereof are omitted.

In an embodiment, the organic light-emitting diodes OLED included in the plurality of pixels, e.g., the first pixel P1, the second pixel P2, and the third pixel P3, may include a plurality of intermediate layers, e.g., first and second intermediate layers 320a and 320b, and a plurality of opposite electrodes, e.g., first and second opposite electrodes 330a and 330b, that are stacked.

As an example, the organic light-emitting diodes OLED may include the first intermediate layer 320a, the first opposite electrode 330a, the second intermediate layer 320b, and the second opposite electrode 330b that are sequentially stacked on the pixel electrode 310. The first intermediate layer 320a and the second intermediate layer 320b may each include an organic emission layer including a fluorescent or phosphorous material that emits red, green, blue, or white light. The organic emission layer may be a low-molecular weight or polymer organic material. At least one functional layer, such as at least one of a hole transport layer (HTL), a hole injection layer (HIL), an electron transport layer (ETL), and an electron injection layer (EIL), may be selectively further arranged under and/or on the organic emission layer. In an embodiment, the first intermediate layer 320a and the second intermediate layer 320b may each include an organic emission layer that emits blue light.

The first opposite electrode 330a and the second opposite electrode 330b may each include a light-transmissive electrode or a reflective electrode. In an embodiment, the opposite electrode 330 may include a transparent or semi-transparent electrode and may include a metal thin film having a low work function. For instance, a material of the opposite electrode 330 may include at least one of Li, Ca, LiF/Ca, LiF/Al, Al, Ag, Mg, and any compound thereof. In addition, a transparent conductive oxide (TCO) layer may be further arranged on the metal thin film, the TCO layer including at least one of ITO, IZO, ZnO, and $In_2O_3$. The first opposite electrode 330a may be a floating electrode.

The first intermediate layer 320a, the second intermediate layer 320b, the first opposite electrode 330a, and the second opposite electrode 330b may each be provided as one body over the plurality of pixels, e.g., the first pixel P1, the second pixel P2, and the third pixel P3.

In an embodiment, color filters, e.g., the first, second, and third color filters CF1, CF2, and CF3, may be provided on the top substrate 200. The color filters, e.g., the first, second, and third color filters CF1, CF2, and CF3, may be introduced to implement a full-color image and improve color purity and outdoor visibility.

The color filters, e.g., the first, second, and third color filters CF1, CF2, and CF3, may be arranged to correspond to the emission areas of the pixels, e.g., the first pixel P1, the second pixel P2, and the third pixel P3, on the top substrate 200. The light-blocking patterns 210 may be arranged between the color filters, e.g., the first, second, and third color filters CF1, CF2, and CF3.

A protective layer 220 may cover the light-blocking pattern 210 and the color filters, e.g., the first, second, and third color filters CF1, CF2, and CF3. The protective layer 220 may include an inorganic material including, for instance, at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The protective layer 220 may include an organic material, such as at least one of polyimide and epoxy.

The first color-converting layer QD1, the second color-converting layer QD2, and the transmissive window TW may respectively overlap the first color filter CF1, the second color filter CF2, and the third color filter CF3 with the protective layer 220 therebetween. An additional protective layer 230 may be further provided over the top substrate 200 to cover the first color-converting layer QD1, the second color-converting layer QD2, and the transmissive window TW. The additional protective layer 230 may include an organic material or an inorganic material.

The first color-converting layer QD1 and the second color-converting layer QD2 may each include quantum dots emitting light having different colors. As an example, the first color-converting layer QD1 may emit red light, and the second color-converting layer QD2 may emit green light. In addition, the transmissive window TW may transmit blue light emitted from the organic light-emitting diode OLED of the third pixel P3. In this case, the first color filter CF1 may be a red color filter, the second color filter CF2 may be a green color filter, and the third color filter CF3 may be a blue color filter.

A display apparatus according to one or more embodiments is applicable to, for example, a large-sized display apparatus. Accordingly, wirings and pads included in the display apparatus may employ metal having high electrical conductivity. Metal having high electrical conductivity tends to be easily damaged and oxidized during a process (e.g., an etching process), and thus, various embodiments introduce an inorganic protective layer and a protective layer that protect the wirings and the pads to provide a display apparatus having high reliability. Thus, at least because the display apparatus according to one or more embodiments includes the pad-protecting layer, a high-quality image may be displayed.

Although certain embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display apparatus comprising:
   a substrate comprising a display area and a peripheral area outside the display area;
   a thin-film transistor and a display element arranged in the display area;
   a pad arranged in the peripheral area;
   a contact layer electrically connected to the pad; and
   a pad-protecting layer on the contact layer, the pad-protecting layer exposing a portion of the contact layer to the outside through a contact hole, wherein the pad comprises:
   a first pad layer connected to a connection wiring through a first contact hole; and
   a second pad layer spaced apart from the first pad layer and connected to the first pad layer through a second contact hole,
   wherein a planar shape of the contact hole is arranged inside a planar shape of the contact layer.

2. The display apparatus of claim 1, wherein a planar center of the first contact hole coincides with a planar center of the second contact hole.

3. The display apparatus of claim 1, wherein a planar shape of the second contact hole is arranged inside a planar shape of the first contact hole.

4. The display apparatus of claim 1, wherein a distance between a periphery of a planar shape of the second contact hole and a periphery of a planar shape of the first contact hole is constant along the periphery of the planar shape of the second contact hole.

5. A display apparatus, comprising:
a substrate comprising a display area and a peripheral area outside the display area;
a thin-film transistor and a display element arranged in the display area;
a pad arranged in the peripheral area;
a contact layer electrically connected to the pad; and
a pad-protecting layer on the contact layer, the pad-protecting layer exposing a portion of the contact layer to the outside,
wherein the pad comprises:
a first pad layer connected to a connection wiring through a first contact hole; and
a second pad layer spaced apart from the first pad layer and connected to the first pad layer through a plurality of second contact holes,
wherein the plurality of second contact holes are arranged inside a shape of the first contact hole in a plan view.

6. The display apparatus of claim 1, wherein:
at least one of the first contact hole and the second contact hole is provided in a plurality; and
a distance between the plurality of first contact holes neighboring each other or a distance between the plurality of second contact holes neighboring each other is 40 μm or more.

7. The display apparatus of claim 6, wherein a distance between the first contact hole and the second contact hole that neighbor each other is greater than the distance between the plurality of first contact holes neighboring each other or the distance between the plurality of second contact holes neighboring each other.

8. The display apparatus of claim 1, wherein a planar shape of the first contact hole is symmetrical to a planar shape of the second contact hole with respect to a center of the pad.

9. The display apparatus of claim 1, wherein the pad-protecting layer covers a periphery of the contact layer.

10. The display apparatus of claim 1, wherein the contact layer comprises indium tin oxide (ITO).

11. The display apparatus of claim 1, wherein the first pad layer is on a same layer as a source electrode of the thin-film transistor.

12. The display apparatus of claim 1, wherein:
each of the first contact hole and the second contact hole is provided in a plurality,
the plurality of first contact holes and the plurality of second contact holes are spaced apart from each other along a periphery of the pad; and
the plurality of first contact holes and the plurality of second contact holes are not arranged in a central portion of the pad.

13. A display apparatus comprising:
a substrate comprising a display area and a peripheral area outside the display area;
a thin-film transistor and a display element arranged in the display area;
a pad arranged in the peripheral area;
a contact layer electrically connected to the pad; and
a pad-protecting layer arranged on the contact layer, the pad-protecting layer exposing a portion of the contact layer to the outside through a contact hole, wherein
a planar shape of the contact hole is arranged inside a planar shape of the contact layer,
in the display area, a light emitting diode including a pixel electrode is arranged on a planarization layer,
the planarization layer and the pad-protecting layer are comprised of a same material and are arranged on a same layer,
the pad is electrically connected to a connection wiring underneath the pad, and
a data line is connected to the connection wiring to transmit data signals to pixels within the display area from the pad.

14. The display apparatus of claim 13, wherein
the contact layer comprises indium tin oxide (ITO).

15. The display apparatus of claim 13, wherein the pad-protecting layer shields a periphery of the contact layer.

16. The display apparatus of claim 13, further comprising:
a thin-film encapsulation layer covering the display element, the thin-film encapsulation layer comprising at least one inorganic encapsulation layer and at least one organic encapsulation layer; and
a top substrate overlapping the thin-film encapsulation layer, the top substrate facing the substrate.

17. The display apparatus of claim 16, wherein the top substrate comprises color converting layers corresponding to at least a portion of a plurality of pixels of the display apparatus, the color converting layers comprising quantum dots.

18. The display apparatus of claim 17, wherein:
the plurality of pixels comprise a first pixel, a second pixel, and a third pixel;
a color-converting layer among the color converting layers corresponding to the first pixel is configured to emit red light;
a color-converting layer among the color converting layers corresponding to the second pixel is configured to emit green light; and
a color-converting layer is not arranged in the third pixel.

19. The display apparatus of claim 16, wherein the top substrate comprises color filters corresponding to a plurality of pixels of the display apparatus.

20. The display apparatus of claim 13, wherein the pad-protecting layer to prevent corrosion of the pad by an etchant upon patterning of the pixel electrode of the light emitting diode.

21. The display apparatus of claim 13, the planarization layer being disposed between the pixel electrode and the substrate.

22. The display apparatus of claim 13, further comprising:
an inorganic protective layer disposed on the pad, wherein
the inorganic protective layer includes an aperture exposing a portion of the pad, and
the contact layer being electrically connected to the pad at a location corresponding to the aperture in the inorganic protective layer.

23. The display apparatus of claim 22, wherein portions of the contact layer are disposed between the inorganic protective layer and the pad-protecting layer in a cross-sectional view.

24. The display apparatus of claim 14, wherein
in the display area, the planarization layer is disposed between the substrate and a light emitting layer of a light emitting diode in a thickness direction of the display apparatus,
the light emitting diode further includes a pixel electrode on the planarization layer and an opposite electrode on the light emitting layer, and
the pixel electrode, the light emitting layer and the opposite electrode overlap each other in a plan view and each overlap the planarization layer in a plan view.

25. The display apparatus of claim 14, further comprising:
an inorganic protective layer disposed on the pad, wherein the inorganic protective layer includes an aperture exposing a portion of the pad, and
the contact layer being electrically connected to the pad at a location corresponding to the aperture in the inorganic protective layer.

\* \* \* \* \*